US012787251B2

(12) United States Patent
Cho et al.

(10) Patent No.: US 12,787,251 B2
(45) Date of Patent: Nov. 3, 2026

(54) SEMICONDUCTOR DEVICE

(71) Applicant: Samsung Electronics Co., Ltd., Suwon-si (KR)

(72) Inventors: Min Hee Cho, Suwon-si (KR); Kiseok Lee, Suwon-si (KR); Wonsok Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 886 days.

(21) Appl. No.: 17/987,011

(22) Filed: Nov. 15, 2022

(65) Prior Publication Data

US 2023/0328961 A1 Oct. 12, 2023

(30) Foreign Application Priority Data

Apr. 8, 2022 (KR) ........................ 10-2022-0043966

(51) Int. Cl.
*H10B 80/00* (2026.01)
*H10B 12/00* (2023.01)

(52) U.S. Cl.
CPC ........... *H10B 12/315* (2023.02); *H10B 12/05* (2023.02); *H10B 12/50* (2023.02)

(58) Field of Classification Search
CPC ...... H10B 12/315; H10B 12/05; H10B 12/50; H10B 63/20; H10B 63/84; H10N 70/826; H10N 70/841
See application file for complete search history.

(56) References Cited

U.S. PATENT DOCUMENTS

| | | | |
|---|---|---|---|
| 8,304,824 B2 | 11/2012 | Kim et al. | |
| 8,796,090 B2 | 8/2014 | Cho et al. | |
| 10,056,482 B2 | 8/2018 | Balakrishnan et al. | |
| 10,629,732 B1 | 4/2020 | Sills et al. | |
| 11,121,258 B2 | 9/2021 | Kula et al. | |
| 11,139,396 B2 | 10/2021 | Karda et al. | |
| 2009/0250736 A1 | 10/2009 | Yoon et al. | |
| 2012/0299090 A1 | 11/2012 | Kim et al. | |
| 2020/0411528 A1 | 12/2020 | Sung et al. | |
| 2021/0183864 A1* | 6/2021 | Ramaswamy ....... | H10B 12/488 |

(Continued)

FOREIGN PATENT DOCUMENTS

| | | | |
|---|---|---|---|
| KR | 1020130103908 A | 9/2013 | |
| KR | 20190110921 A * | 10/2019 | ............. H01L 29/78 |

(Continued)

*Primary Examiner* — Samuel Park
(74) *Attorney, Agent, or Firm* — Muir Patent Law, PLLC

(57) ABSTRACT

A semiconductor device includes a first conductive line that extends in a first horizontal direction, a plurality of semiconductor patterns on the first conductive line and spaced apart from each other in the first horizontal direction wherein each of the semiconductor patterns includes a first vertical part and a second vertical part that are opposite to each other in the first horizontal direction, a second conductive line that extends in a second horizontal direction between the first vertical part and the second vertical part of each of the semiconductor patterns, the second horizontal direction intersecting the first horizontal direction, a gate dielectric pattern between the first vertical part and the second vertical part and between the second vertical part and the second conductive line, and a blocking pattern between neighboring semiconductor patterns.

16 Claims, 24 Drawing Sheets

(56) References Cited

U.S. PATENT DOCUMENTS

| | | | | |
|---|---|---|---|---|
| 2021/0391461 | A1 | 12/2021 | Karda et al. | |
| 2022/0130832 | A1* | 4/2022 | Tsai | H10B 12/312 |
| 2022/0246180 | A1 | 8/2022 | Lee et al. | |

FOREIGN PATENT DOCUMENTS

| | | | |
|---|---|---|---|
| KR | 1020220043981 | A | 4/2022 |
| TW | 201133798 | A | 10/2011 |

* cited by examiner

SEMICONDUCTOR DEVICE

CROSS-REFERENCE TO RELATED APPLICATION

This U.S. nonprovisional application claims priority under 35 U.S.C § 119 to Korean Patent Application No. 10-2022-0043966 filed on Apr. 8, 2022 in the Korean Intellectual Property Office, the disclosure of which is hereby incorporated by reference in its entirety.

BACKGROUND

The present inventive concepts relate to a semiconductor device, and more particularly, to a semiconductor device including vertical channel transistors and a method of fabricating the same.

A reduction in design rule of semiconductor devices may be desirable for integration and operating speed, but may sacrifice a fabrication yield of semiconductor devices. Accordingly, transistors with vertical channels have been suggested to increase their integration, resistance, current drive capability, etc.

SUMMARY

Some embodiments of the present inventive concepts provide a semiconductor device having increased electrical properties and improved reliability.

An object of the present inventive concepts is not limited to the mentioned above, and other objects which have not been mentioned above will be clearly understood to those skilled in the art from the following description.

According to some embodiments of the present inventive concepts, a semiconductor device may comprise: a first conductive line that extends in a first horizontal direction; a plurality of semiconductor patterns on the first conductive line and spaced apart from each other in the first horizontal direction, each of the semiconductor patterns including a first vertical part and a second vertical part that are opposite to each other in the first horizontal direction; a second conductive line that extends in a second horizontal direction between the first vertical part and the second vertical part of each of the semiconductor patterns, the second horizontal direction intersecting the first horizontal direction; a gate dielectric pattern between the first vertical part and the second vertical part and between the second vertical part and the second conductive line; and a blocking pattern between neighboring semiconductor patterns.

According to some embodiments of the present inventive concepts, a semiconductor device may comprise: a first conductive line that extends in a first horizontal direction; a semiconductor pattern that includes a first vertical part and a second vertical part that are opposite to each other in the first horizontal direction on the first conductive line; a second conductive line that includes a first sub-conductive line covering an inner lateral surface of the first vertical part and a second sub-conductive line covering an inner lateral surface of the second vertical part, the inner lateral surface of the first vertical part and the inner lateral surface of the second vertical part being opposite to each other in the first horizontal direction; a gate dielectric pattern between the inner lateral surface of the first vertical part and the first sub-conductive line and between the inner lateral surface of the second vertical part and the second sub-conductive line; and a plurality of blocking patterns on the first conductive line and adjacent to a lower portion of an outer lateral surface of the first vertical part and to a lower portion of an outer lateral surface of the second vertical part.

According to some embodiments of the present inventive concepts, a semiconductor device may comprise: a peripheral circuit structure that includes a peripheral gate structure on a substrate and a first interlayer dielectric layer covering the peripheral gate structure; a bit line that extends in a first horizontal direction on the peripheral circuit structure, the first horizontal direction being parallel to a top surface of the substrate; a plurality of semiconductor patterns on the bit line and spaced apart from each other in the first horizontal direction, each of the semiconductor patterns including a first vertical part and a second vertical part that are opposite to each other in the first horizontal direction; a first dielectric pattern between neighboring semiconductor patterns, the first dielectric pattern extending in a second horizontal direction that is parallel to the top surface of the substrate and intersects the first horizontal direction; a blocking pattern between the neighboring semiconductor patterns and between the bit line and the first dielectric pattern; a second dielectric pattern that extends in the second horizontal direction between the first vertical part and the second vertical part of each of the semiconductor patterns; a first word line between the first vertical part and the second dielectric pattern; a second word line between the second vertical part and the second dielectric pattern; a gate dielectric pattern between the first vertical part and the first word line and between the second vertical part and the second word line; and a plurality of data storage patterns that are correspondingly electrically connected to the first and second vertical parts of the semiconductor patterns.

DETAIL PARTED DESCRIPTION OF EMBODIMENTS

It will be hereinafter discussed a semiconductor memory device and a method of fabricating the same according to some embodiments of the present inventive concepts in conjunction with the accompanying drawings.

Figure 1:
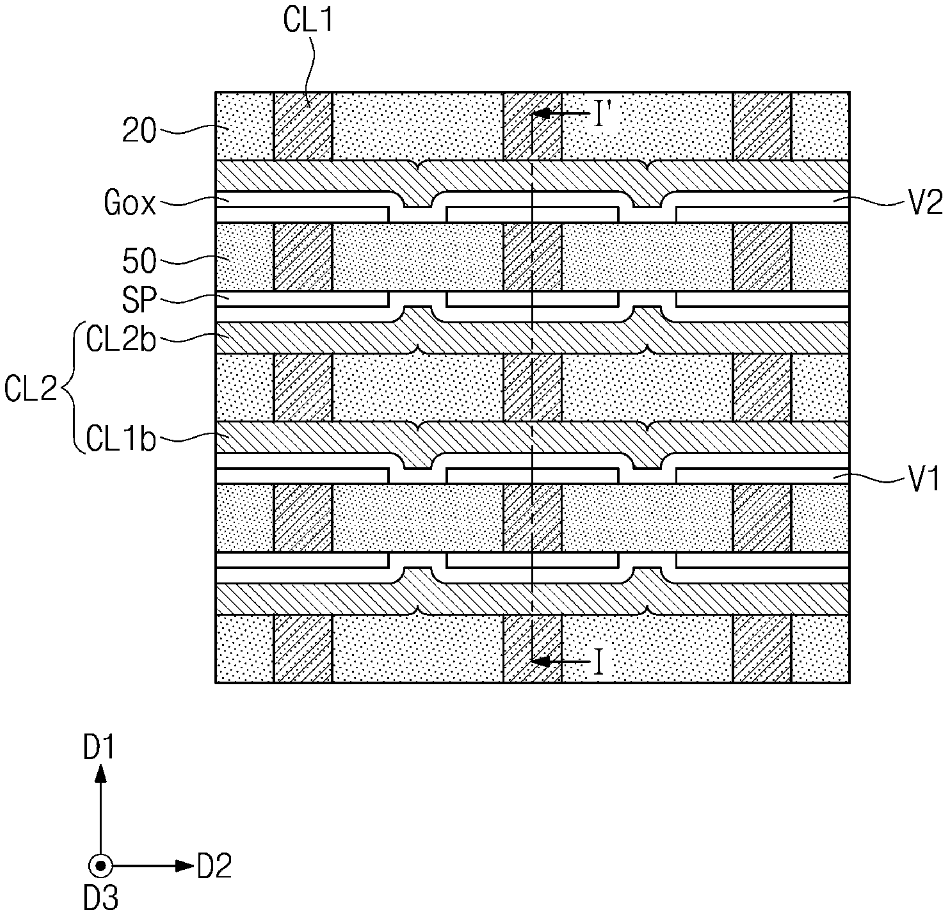
FIG. 1 illustrates a plan view showing a semiconductor device according to some embodiments of the present inventive concepts.
Figure 2:
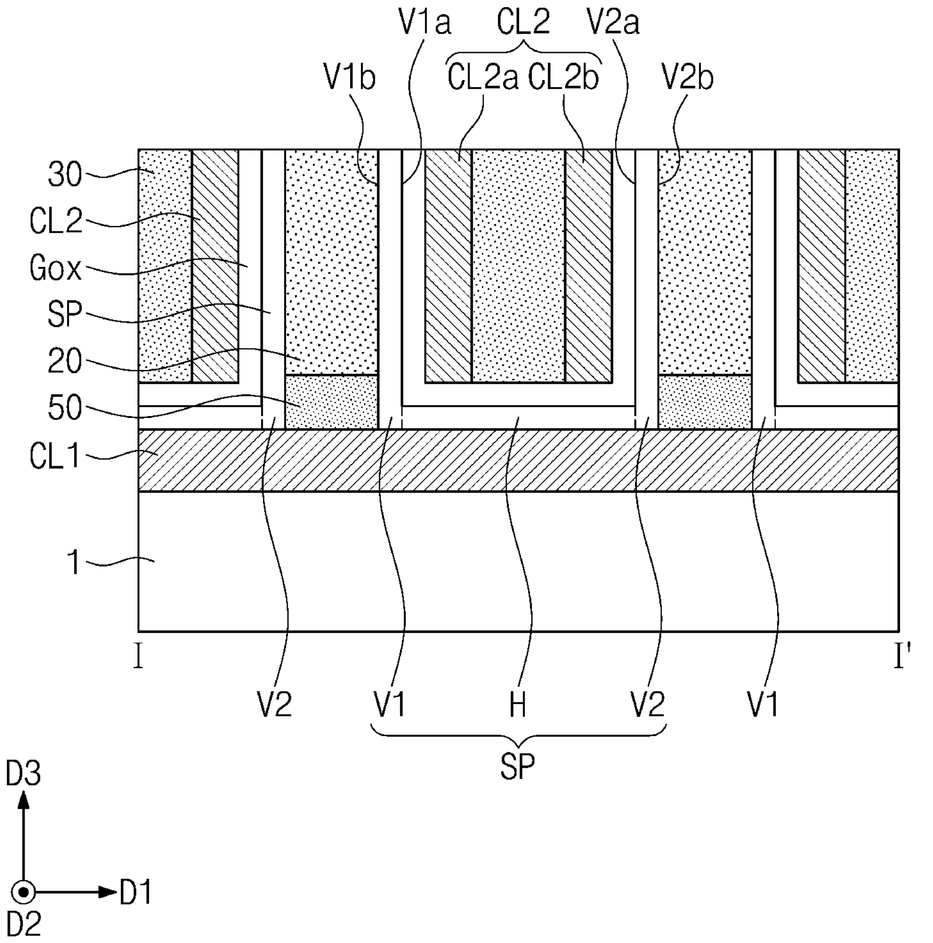
FIG. 2 illustrates a cross-sectional view taken along line I-I' of FIG. 1.

FIG. 1 illustrates a plan view showing a semiconductor device according to some embodiments of the present inventive concepts. FIG. 2 illustrates a cross-sectional view taken along line I-I' of FIG. 1.

Referring to FIGS. 1 and 2, a substrate 1 may be provided. The substrate 1 may be a semiconductor substrate. The substrate 1 may be, for example, a silicon substrate, a germanium substrate, or a silicon-germanium substrate.

A first conductive line CL1 may be provided on the substrate 1. The first conductive line CL1 may extend along a first direction D1 (i.e., a first horizontal direction) parallel to a top surface of the substrate 1. The first conductive line CL1 may be provided in plural. The first conductive lines CL1 may be spaced apart from each other in a second direction D2 (i.e., a second horizontal direction) that intersects (e.g., vertically crosses) the first direction D1. The first conductive lines CL1 may be electrically connected to wiring lines in the substrate 1.

The first conductive line CL1 may include or may be formed of, for example, at least one selected from doped polysilicon, metal (e.g., Al, Cu, Ti, Ta, Ru, W, Mo, Pt, Ni, or Co), conductive metal nitride (e.g., TiN, TaN, WN, NbN, TiAlN, TiSiN, TaSiN, or RuTiN), conductive metal silicide, and conductive metal oxide (e.g., PtO, $RuO_2$, $IrO_2$, SRO ($SrRuO_3$), BSRO($(Ba,Sr)RuO_3$), CRO($CaRuO_3$), LSCo), but the present inventive concepts are not limited thereto. The first conductive line CL1 may include a single or multiple layer of the materials mentioned above. In some embodiments, the first conductive line CL1 may include a two-dimensional semiconductor material, such as graphene, carbon nano-tube, and any combination thereof.

A semiconductor pattern SP may be disposed on the first conductive line CL1. The semiconductor pattern SP may be provided in plural. The semiconductor patterns SP may be spaced apart from each other in the first and second directions D1 and D2.

The semiconductor pattern SP may include a first vertical part V1 and a second vertical part V2 that are opposite to each other. The first vertical part V1 and the second vertical part V2 may be opposite to each other in the first direction D1. On the first conductive line CL1, each of the first and second vertical parts V1 and V2 may extend in a third direction D3 (i.e., a vertical direction) perpendicular to the top surface of the substrate 1. The first vertical part V1 may have an inner lateral surface V1*a* and an outer lateral surface V1*b* that are orthogonal to the first direction D1, and the second vertical part V2 may have an inner lateral surface V2*a* and an outer lateral surface V2*b* that are orthogonal to the first direction D1. The inner lateral surface V1*a* of the first vertical part V1 may be opposite in the first direction D1 to the inner lateral surface V2*a* of the second vertical part V2. The outer lateral surface V1*b* of the first vertical part V1 of the semiconductor pattern SP may be opposite in the first direction D1 to the outer lateral surface V2*b* of the second vertical part V2 of another semiconductor pattern SP adjacent in the first direction D1 to the semiconductor pattern SP.

Each of the first and second vertical parts V1 and V2 may include source/drain regions. The first vertical part V1 may include a first upper source/drain region and a first lower source/drain region on its top and bottom ends thereof, and may also include a first channel region between the first upper source/drain region and the first lower source/drain region. The second vertical part V2 may include a second upper source/drain region and a second lower source/drain region on its top and bottom ends thereof, and may also include a second channel region between the second upper source/drain region and the second lower source/drain region.

According to an embodiment, the semiconductor pattern SP may further include a horizontal part H that connects the first and second vertical parts V1 and V2 with each other. The horizontal part H may connect lower portions of the first and second vertical parts V1 and V2 with each other. The horizontal part H may be disposed on and in contact with the first conductive line CL1. The term "contact," as used herein, refers to a direct connection (i.e., touching) unless the context indicates otherwise.

The semiconductor pattern SP may include or may be formed of an oxide semiconductor, such as at least one selected from $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, and $In_xGa_yO$, where x, y, and z are real numbers. For example, the semiconductor pattern SP may include or may be formed of indium-gallium-zinc oxide (IGZO). The semiconductor pattern SP may have a single or multiple layer of the oxide semiconductor mentioned above. The present inventive concepts are not limited thereto. In an embodiment, the semiconductor pattern SP may include or may be formed of an amorphous, crystalline, or polycrystalline oxide semiconductor. In some embodiments, the semiconductor pattern SP may have a bandgap energy greater than that of silicon. For example, the semiconductor pattern SP may have a bandgap energy selected from a range of about 1.5 eV to about 5.6 eV. For example, the semiconductor pattern SP may have desirable channel performance when its bandgap energy has a value selected from a range of about 2.0 eV to about 4.0 eV. The semiconductor pattern SP may be polycrystalline or amorphous, but the present inventive concepts are not limited thereto. In some embodiments, the semiconductor pattern SP may include or may be formed of a two-dimensional semiconductor material, such as graphene, carbon nanotube, and any combination thereof. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

A second conductive line CL2 may be disposed between the first vertical part V1 and the second vertical part V2. The second conductive line CL2 may be provided in plural. The second conductive lines CL2 may extend in the second direction D2 and may be spaced apart from each other in the first direction D1. Each of the second conductive lines CL2 may include a first sub-conductive line CL2*a* and a second sub-conductive line CL2*b*, and the first sub-conductive line CL2*a* and the second sub-conductive line CL2*b* may be opposite to each other in the first direction D1. The first sub-conductive line CL2*a* may cover the inner lateral surface V1*a* of the first vertical part V1. For example, the inner lateral surface V1*a* of the first vertical part V1 may be lined with the first sub-conductive line CL2*a*. The first sub-conductive line CL2*a* may adjoin and control the first channel region. The second sub-conductive line CL2*b* may cover the inner lateral surface V2*a* of the second vertical part V2. For example, the inner lateral surface V2*a* of the second vertical part V2 may be lined with the second sub-conductive line CL2*b*. The second sub-conductive line CL2*b* may adjoin and control the second channel region.

The second conductive line CL2 may include or may be formed of, for example, at least one selected from doped polysilicon, metal (e.g., Al, Cu, Ti, Ta, Ru, W, Mo, Pt, Ni, or Co), conductive metal nitride (e.g., TiN, TaN, WN, NbN, TiAlN, TiSiN, TaSiN, or RuTiN), conductive metal silicide, and conductive metal oxide (e.g., PtO, $RuO_2$, $IrO_2$, SRO ($SrRuO_3$), BSRO(($Ba,Sr)RuO_3$), CRO($CaRuO_3$), LSCo), but the present inventive concepts are not limited thereto. The second conductive line CL2 may have a single or multiple layer of the materials mentioned above. In some embodiments, the second conductive line CL2 may include or may be formed of a two-dimensional semiconductor material, such as graphene, carbon nano-tube, and any combination thereof A gate dielectric pattern Gox may be interposed between the semiconductor pattern SP and the second conductive line CL2. For example, the gate dielectric pattern Gox may be interposed between the first sub-conductive line CL2*a* and the inner lateral surface V1*a* of the first vertical part V1 and between the second sub-conductive line CL2*b* and the inner lateral surface V2*a* of the second vertical part V2. The gate dielectric pattern Gox may further extend between the horizontal part H and the second conductive line CL2. The gate dielectric pattern Gox may separate the second conductive line CL2 from the semiconductor pattern SP. The gate dielectric pattern Gox may have a uniform thickness to cover the semiconductor pattern SP.

For example, as shown in FIG. 2, the gate dielectric pattern Gox may include a portion interposed between the first vertical part V1 and the first sub-conductive line CL2*a* and a portion interposed between the second vertical part V2 and the second sub-conductive line CL2*b*, and the portions of the gate dielectric pattern Gox may extend onto the horizontal part H to be connected with each other.

In an embodiment, although not shown, a plurality of gate dielectric patterns Gox may be correspondingly interposed between the first vertical part V1 and the first sub-conductive line CL2*a* and between the second vertical part V2 and the second sub-conductive line CL2*b*, and the plurality of gate dielectric patterns Gox may be separated from each other without being connected with each other on the horizontal part H. In this configuration, the gate dielectric patterns Gox may be spaced apart from each other on the horizontal part H.

The gate dielectric pattern Gox may include or may be formed of at least one selected from silicon oxide, silicon oxynitride, and a high-k dielectric material whose a dielectric constant is greater than that of silicon oxide. The high-k dielectric material may include metal oxide or metal oxynitride. For example, the high-k dielectric material used as the gate dielectric pattern Gox may include at least one selected from $HfO_2$, HfSiO, HfSiON, HfTaO, HfTiO, HfZrO, $ZrO_2$, $A1_2O_3$, and any combination thereof, but the present inventive concepts are not limited thereto.

A blocking pattern 50 may be interposed between the semiconductor patterns SP that neighbor each other in the first direction D1. The blocking pattern 50 may be interposed between the outer lateral surface V1*b* of the first vertical part V1 of one among the neighboring semiconductor patterns SP and the outer lateral surface V2*b* of the second vertical part V2 of another among the neighboring semiconductor patterns SP. The blocking pattern 50 may be disposed adjacent to lower portions of the neighboring semiconductor patterns SP on the first conductive line CL1. For example, the blocking pattern 50 may be in contact with the lower portions of the neighboring semiconductor patterns SP on the first conductive line CL1. The blocking pattern 50 may cover a portion, not covered with the semiconductor patterns SP, of the first conductive line CL1. For example, the blocking pattern 50 may be in contact with the first conductive line CL1.

The blocking pattern 50 may be provided in plural. For example, neighboring blocking patterns 50 may be spaced apart from each other in the first direction D1 and may be disposed on opposite sides of the semiconductor pattern SP. For more detail, one blocking pattern 50 may be disposed adjacent to a lower portion of the outer lateral surface V1*b* of the first vertical part V1 included in the semiconductor pattern SP, and a neighboring blocking pattern 50 may be disposed adjacent to a lower portion of the outer lateral surface V2*b* of the second vertical part V2 included in the semiconductor pattern SP. As shown in FIG. 1, the blocking patterns 50 may extend in the second direction D2.

The blocking pattern 50 may include or may be formed of at least one selected from a dielectric material and a conductive material. The dielectric material may include, for example, at least one selected from silicon nitride (e.g., SiNx) and metal oxide (e.g., AlOx). The conductive material may include, for example, at least one selected from a metallic material (e.g., Ti, W, Ru, Al, Ti, Ta or Ni) and a metallic compound (e.g., TiN, WO).

A first dielectric pattern 20 may further be interposed between the neighboring semiconductor patterns SP. The first dielectric pattern 20 may be disposed on the blocking pattern 50, and at least a portion of the first dielectric pattern 20 may vertically overlap the blocking pattern 50. The first dielectric pattern 20 may be provided in plural. The first dielectric patterns 20 may extend in the second direction D2 while extending across the first conductive line CL1, and may be spaced apart from each other in the first direction D1.

The blocking pattern 50 may vertically separate the first dielectric pattern 20 from the first conductive line CL1, and may not allow the first dielectric pattern 20 to contact lower portions of the first and second vertical parts V1 and V2 of the semiconductor pattern SP. The blocking pattern 50 may be interposed between the first conductive line CL1 and the first dielectric pattern 20. The first dielectric pattern 20 may include or may be formed of, for example, an oxygen (O) atom. For example, the first dielectric pattern 20 may include or may be formed of at least one selected from silicon oxide, silicon oxynitride, and low-k dielectric.

A second dielectric pattern 30 may be disposed between the first and second sub-conductive lines CL2*a* and CL2*b* of the second conductive line CL2. The second dielectric pattern 30 may be provided in plural. The second dielectric pattern 30 may extend in the second direction D2 while extending across the first conductive line CL1, and may be spaced apart from each other in the first direction D1. The first and second dielectric patterns 20 and 30 may be arranged alternately in the first direction D1. The second dielectric pattern 30 may include or may be formed of, for example, at least one selected from silicon oxide, silicon nitride, silicon oxynitride, and low-k dielectric.

According to the present inventive concepts, the blocking pattern 50 may be disposed adjacent to a lower portion of the semiconductor pattern SP. The blocking pattern 50 may vertically separate the first dielectric pattern 20 from the first conductive line CL1, and the first dielectric pattern 20 may not be in contact with the lower portions of the first and second vertical parts V1 and V2 included in the semiconductor pattern SP. In this configuration, the lower portions of the first and second vertical parts V1 and V2 may be prevented from oxidation caused by oxygen (O) of the first dielectric pattern 20 in an annealing process for fabricating a semiconductor device. For example, in an annealing process for diffusing at least one selected from hydrogen (H) and deuterium (D) into the semiconductor pattern SP, oxygen (O) of the first dielectric pattern 20 may also diffuse into the lower portions of the first and second vertical parts V1 and V2 without a diffusion barrier such as the blocking pattern 50 according to the present invention. The blocking pattern 50 may prevent the diffusion (O) from diffusing into the lower portions of the first and second vertical parts V1 and V2, thereby prevent oxidation thereof The block pattern 50 may serve as a diffusion barrier against the oxygen (O) of the first dielectric pattern 20 in an annealing process. Thus, there may be a reduction in contact resistance between the first conductive line CL1 and the semiconductor pattern SP, and as a result, the reliability and electrical properties of a semiconductor device may be improved.

Figure 3A:
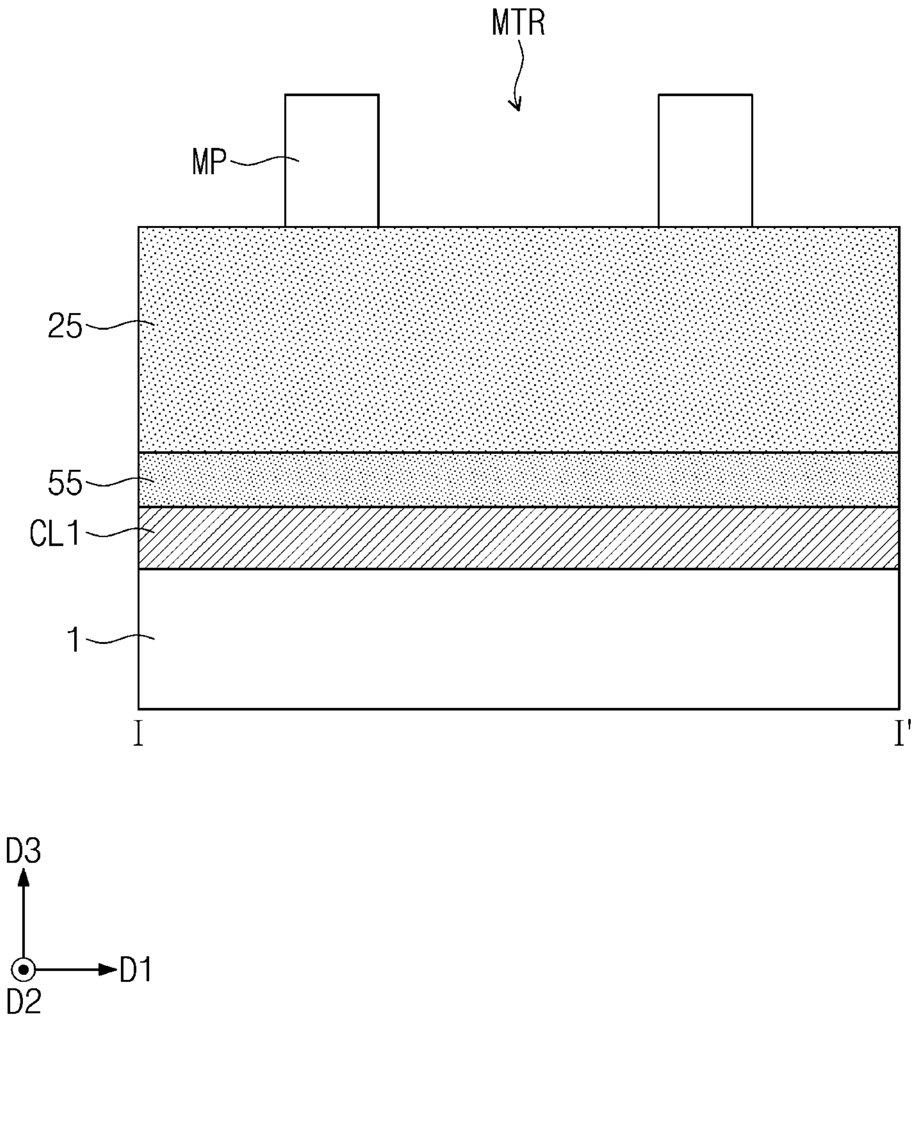
FIGS. 3A to 3C illustrate cross-sectional views showing a method of fabricating the semiconductor device as depicted in FIG. 2.
Figure 3B:
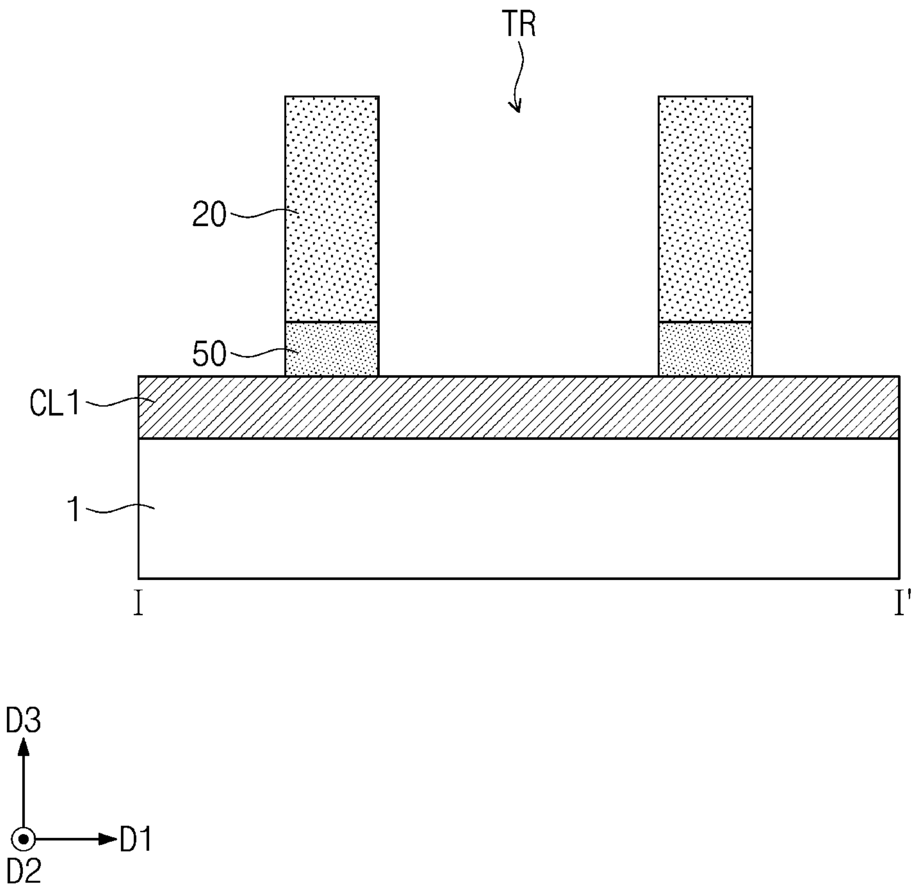
Figure 3C:
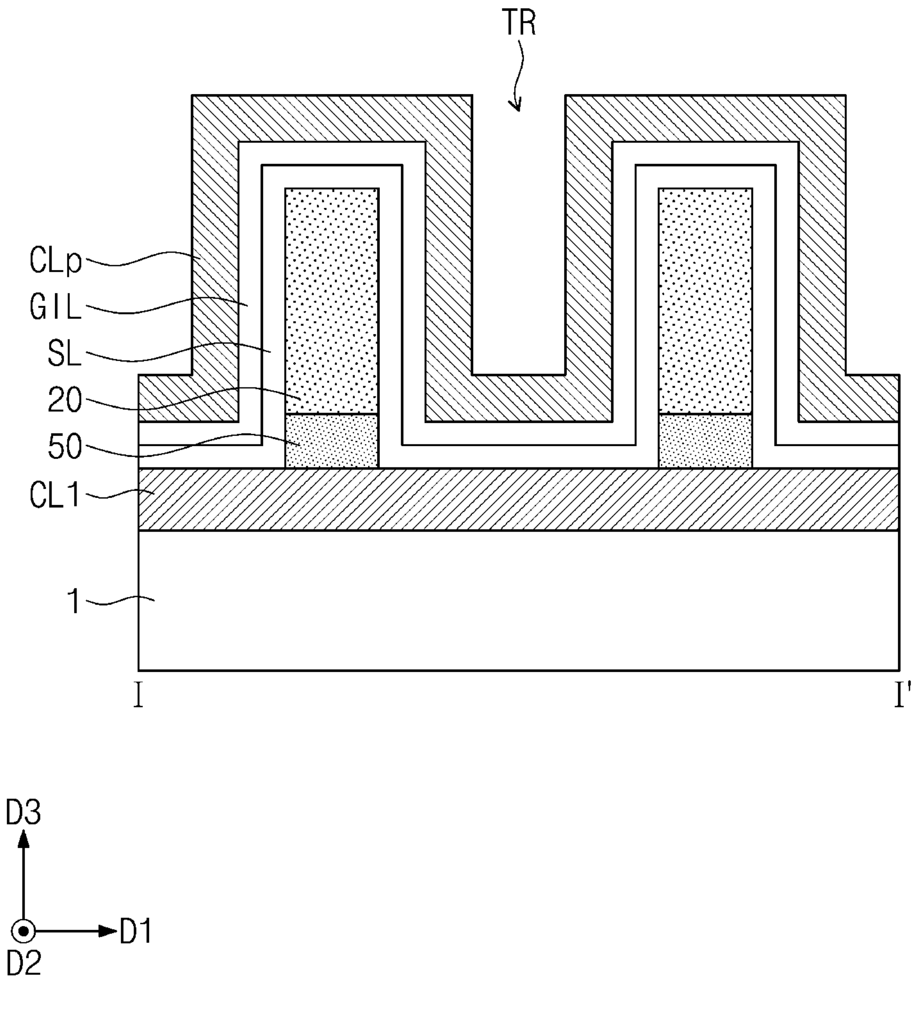

FIGS. 3A to 3C illustrate cross-sectional views showing a method of fabricating the semiconductor device as depicted in FIG. 2. With reference to FIGS. 1 and 3A to 3C, the following will describe a method of fabricating the semiconductor device as depicted in FIG. 2. For brevity of description, a repetitive description will be omitted.

Referring to FIGS. 1 and 3A, a first conductive line CL1 may be formed on a substrate 1. The first conductive line CL1 may be formed in plural. The first conductive lines CL1 may extend in a first direction D1 and may be spaced apart from each other in a second direction D2. The first conductive lines CL1 may be formed to be electrically connected to wiring lines in the substrate 1. The formation of the first conductive line CL1 may include depositing a first conductive layer (not shown) on the substrate 1, and patterning the first conductive layer to form the first conductive line CL1.

A blocking layer 55 and a first dielectric layer 25 may be sequentially formed on the first conductive line CL1. The blocking layer 55 and the first dielectric layer 25 may entirely cover a top surface of the substrate 1. The blocking layer 55 may include or may be formed of, for example, at least one selected from a dielectric material and a conductive material. The first dielectric layer 25 may include, for example, an oxygen (O) atom. The blocking layer 55 may be interposed between the first conductive line CL1 and the first dielectric layer 25. The blocking layer 55 may separate the first dielectric layer 25 from the first conductive line CL1.

Mask patterns MP may be formed on the first dielectric layer 25. The mask patterns MP may include line patterns that extend in the second direction D2 and are spaced apart from each other in the first direction D1. The mask patterns MP may have a mask trench MTR, and the mask trench MTR may be provided in plural. The mask trenches MTR may be spaced apart from each other in the first direction D1 and may extend in the second direction D2. The formation of the mask patterns MP may include forming a mask layer (not shown) on the first dielectric layer 25, and patterning the mask layer to form the mask patterns MP.

Referring to FIGS. 1 and 3B, a first dielectric pattern 20 and a blocking pattern 50 may be formed on the first conductive line CL1. The first dielectric pattern 20 and the blocking pattern 50 may each be formed in plural. The formation of the first dielectric pattern 20 and the blocking pattern 50 may include using the mask pattern MP of FIG. 3A as an etching mask to etch the first dielectric layer 25 and the blocking layer 55. Therefore, the first dielectric pattern 20 and the blocking pattern 50 may vertically overlap the mask pattern MP of FIG. 3A. The first dielectric pattern 20 and the blocking pattern 50 may extend in the second direction D2. The first dielectric pattern 20 and the blocking pattern 50 may have a trench region TR, and the trench region TR may vertically overlap the mask trench MTR of FIG. 3A. The trench region TR may be provided in plural, and may extend in the second direction D2. The trench region TR may externally expose lateral surfaces of the first dielectric pattern 20, lateral surfaces of the blocking pattern 50, and a portion of a top surface of the first conductive line CL1.

Referring to FIGS. 1 and 3C, a semiconductor layer SL, a gate dielectric layer GIL, and a second conductive layer CLp may be formed to entirely cover the top surface of the substrate 1. The semiconductor layer SL, the gate dielectric layer GIL, and the second conductive layer CLp may conformally cover the lateral surfaces of the first dielectric pattern 20, the lateral surfaces of the blocking pattern 50, and the portion of the top surface of the first conductive line CL1, which are exposed by the trench region TR. The semiconductor layer SL, the gate dielectric layer GIL, and the second conductive layer CLp may fill a portion of the trench region TR.

The formation of the semiconductor layer SL, the gate dielectric layer GIL, and the second conductive layer CLp may include depositing the semiconductor layer SL to entirely cover the top surface of the substrate 1, removing a portion of the substrate 1, and sequentially depositing the gate dielectric layer GIL and the second conductive layer CLp. The removed portion of the semiconductor layer SL may be a semiconductor layer on regions that lie between neighboring first conductive lines CL and extend in the first direction D1, when viewed in a plan view. The removal may divide the semiconductor layer SL into a plurality of pieces, and the semiconductor layers SL may be spaced apart from each other in the second direction D2.

The semiconductor layer SL, the gate dielectric layer GIL, and the second conductive layer CLp may be formed by using, for example, at least one selected from physical vapor deposition (PVD), thermal chemical deposition (thermal CVD), low pressure chemical vapor deposition (LPCVD), plasma enhanced chemical vapor deposition (PECVD), and atomic layer deposition (ALD).

For example, as shown in FIG. 3C, after the formation of the semiconductor layer SL, the semiconductor layer SL may cover a top surface of the first dielectric pattern 20. In this step, the gate dielectric layer GIL and the second conductive layer CLp may cover the semiconductor layer SL on the top surface of the first dielectric pattern 20.

In an embodiment, although not shown, after the formation of the semiconductor layer SL, the semiconductor layer SL on the top surface of the first dielectric pattern 20 may be removed before the formation of the gate dielectric layer GIL and the second conductive layer CLp. In this case, a semiconductor pattern SP of FIG. 2 may be formed due to the removal of the semiconductor layer SL on the top surface of the first dielectric pattern 20, and the gate dielectric layer GIL may cover the top surface of the first dielectric pattern 20. For example, the gate dielectric layer GIL may contact the top surface of the first dielectric pattern 20. Afterwards, the second conductive layer CLp may cover the gate dielectric layer GIL on the top surface of the first dielectric pattern 20.

Referring to FIGS. 1 and 2, a semiconductor pattern SP, a gate dielectric pattern Gox, and a second conductive line CL2 may be formed. The formation of the semiconductor pattern SP, the gate dielectric pattern Gox, and the second conductive line CL2 may include patterning the semiconductor layer SL, the gate dielectric layer GIL, and the second conductive layer CLp on the top surface of the first dielectric pattern 20 to be divided into a plurality of semiconductor patterns SP, a plurality of gate dielectric patterns Gox, and a plurality of second conductive lines CL2, respectively.

The semiconductor pattern SP may include a first vertical part V1 and a second vertical part V2, and the second conductive line CL2 may include a first sub-conductive line CL2*a* on an inner lateral surface V1*a* of the first vertical part V1 and a second sub-conductive line CL2*b* on an inner lateral surface V2*a* of the second vertical part V2. The gate dielectric pattern Gox may be interposed between the first sub-conductive line CL2*a* and the inner lateral surface V1*a* of the first vertical part V1 and between the second sub-conductive line CL2*b* and the inner lateral surface V2*a* of the second vertical part V2. The first dielectric pattern 20 and the blocking pattern 50 may be interposed between an outer lateral surface V1*b* of the first vertical part V1 included in the semiconductor pattern SP and an outer lateral surface V2*b* of the second vertical part V2 included in a neighboring semiconductor pattern SP. The blocking pattern 50 may be disposed adjacent to a lower portion of the first vertical part V1 and a lower portion of the second vertical part V2.

Thereafter, a second dielectric pattern 30 may be formed between the first sub-conductive line CL2*a* and the second sub-conductive line CL2*b*. The second dielectric pattern 30 may fill the trench region TR. The formation of the second dielectric pattern 30 may include forming a second dielectric layer (not shown) that fills the trench region TR and covers the semiconductor pattern SP, the gate dielectric pattern Gox, and the second conductive line CL2, and removing an upper portion of the second dielectric layer to be divided into a plurality of second dielectric patterns 30.

Figure 4:
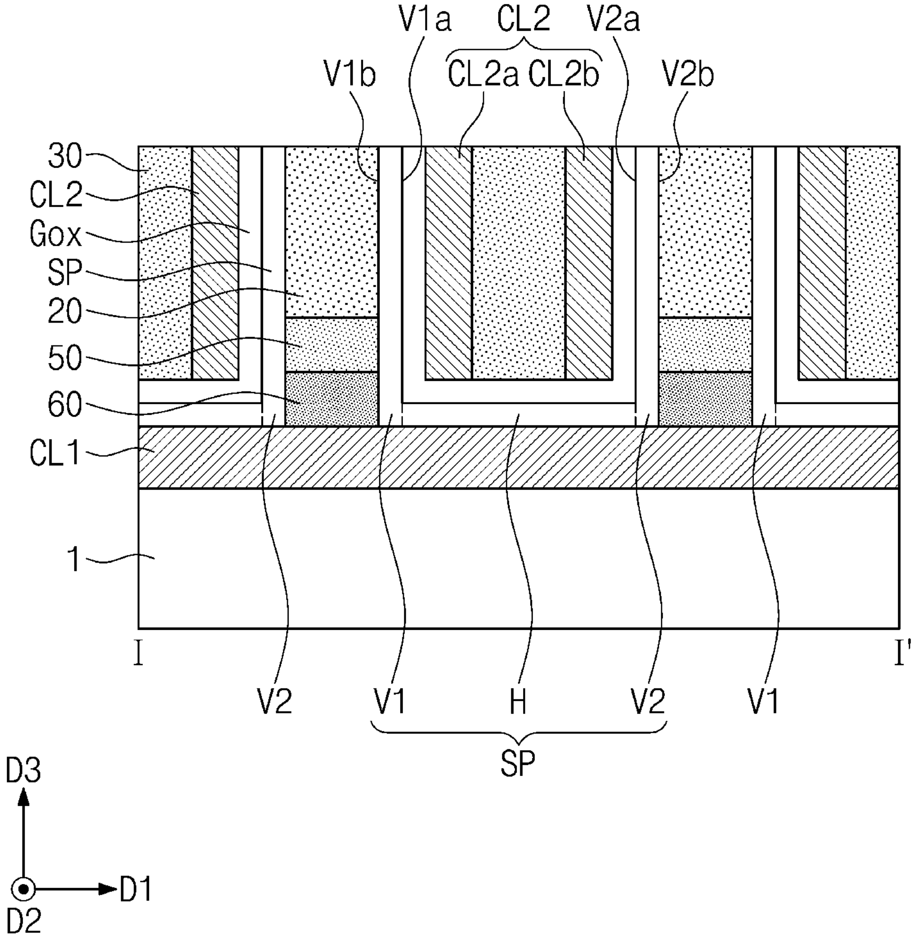
FIG. 4 illustrates a cross-sectional view taken along line I-I' of FIG. 1.

FIG. 4 illustrates a cross-sectional view taken along line I-I' of FIG. 1. For brevity of description, a repetitive description will be omitted.

Referring to FIGS. 1 and 4, a lower pattern 60 may be arranged on the first conductive line CL1. The lower pattern 60 may be interposed between neighboring semiconductor patterns SP and between the first conductive line CL1 and the blocking pattern 50. The blocking pattern 50 may be interposed between the lower pattern 60 and the first dielectric pattern 20. The lower pattern 60 may vertically overlap the blocking pattern 50 and may be provided in plural. The lower patterns 60, together with the blocking patterns 50, may extend in the second direction D2 and may be spaced apart from each other in the first direction D1. The lower pattern 60 may be disposed adjacent to lower portions of the semiconductor patterns SP that neighbor the lower pattern 60, and may allow the first conductive line CL1 and the blocking pattern 50 to vertically overlap each other. The blocking pattern 50 and the lower pattern 60 may allow the first dielectric pattern 20 and the first conductive line CL1 to vertically separate from each other.

The lower pattern 60 may include at least one selected from hydrogen (H) and deuterium (D). For example, the lower pattern 60 may include or may be formed of silicon oxide that contains at least one selected from hydrogen (H) and deuterium (D).

When an annealing process is performed to fabricate a semiconductor device, one of hydrogen and deuterium contained in the lower pattern 60 may diffuse into a lower portion of the semiconductor pattern SP. Hydrogen or deuterium diffused into the semiconductor pattern SP may complement or cure a lattice defect in the semiconductor pattern SP or in an interface between the semiconductor pattern SP and the first conductive line CL1. Thus, there may be a reduction in contact resistance between the first conductive line CL1 and the semiconductor pattern SP, and as a result, a semiconductor device may increase in reliability and electrical properties.

FIGS. 5A to 5D illustrate cross-sectional views showing a method of fabricating the semiconductor device as depicted in FIG. 4. With reference to FIGS. 1 and 5A to 5D, the following will describe a method of fabricating the semiconductor device as depicted in FIG. 4. For brevity of description, a repetitive description will be omitted.

Figure 5A:
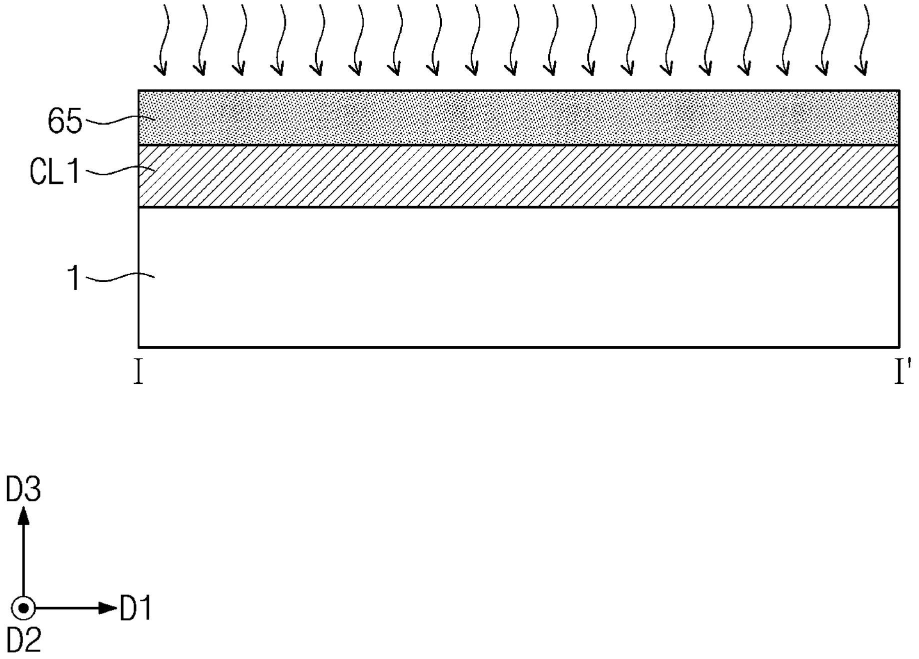
FIGS. 5A to 5D illustrate cross-sectional views showing a method of fabricating the semiconductor device as depicted in FIG. 4.

Referring to FIGS. 1 and 5A, a first conductive line CL1 may be formed on a substrate 1, and a lower layer 65 may be formed on the first conductive line CL1. The lower layer 65 may be entirely formed on a top surface of the substrate 1. The formation of the lower layer 65 may include depositing the lower layer 65 on the substrate 1, and injecting at least one selected from hydrogen (H) and deuterium (D) into the lower layer 65. For example, the injecting process may include allowing the lower layer 65 to undergo an annealing process to inject at least one selected from hydrogen (H) and deuterium (D). In an embodiment, the injecting process may include performing an implantation process on the lower layer 65. Therefore, the lower layer 65 may include at least one selected from hydrogen (H) and deuterium (D).

Figure 5B:
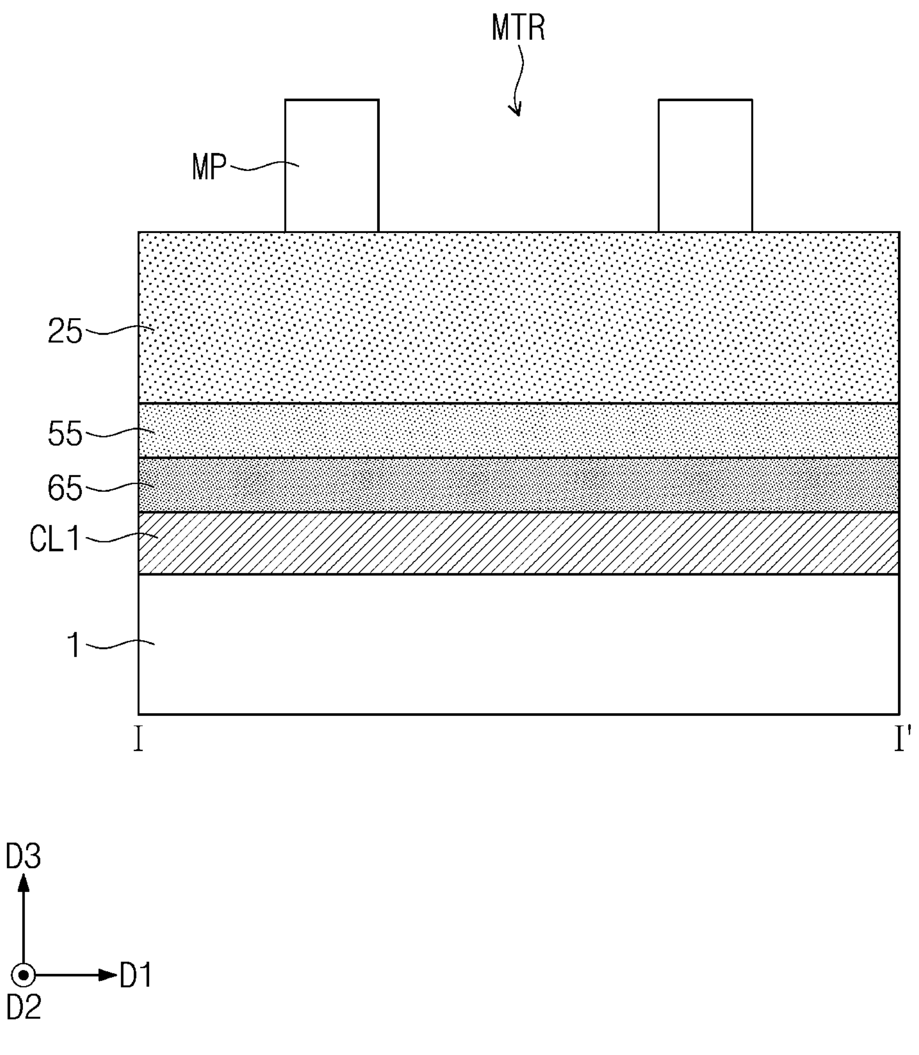

Referring to FIGS. 1 and 5B, a blocking layer 55, a first dielectric layer 25, and a mask pattern MP may be sequentially formed on the lower layer 65. The blocking layer 55 and the first dielectric layer 25 may be entirely formed on a top surface of the lower layer 65. The blocking layer 55 and the lower layer 65 may separate the first dielectric layer 25 form the first conductive line CL1. The mask pattern MP may have a mask trench MTR.

Figure 5C:
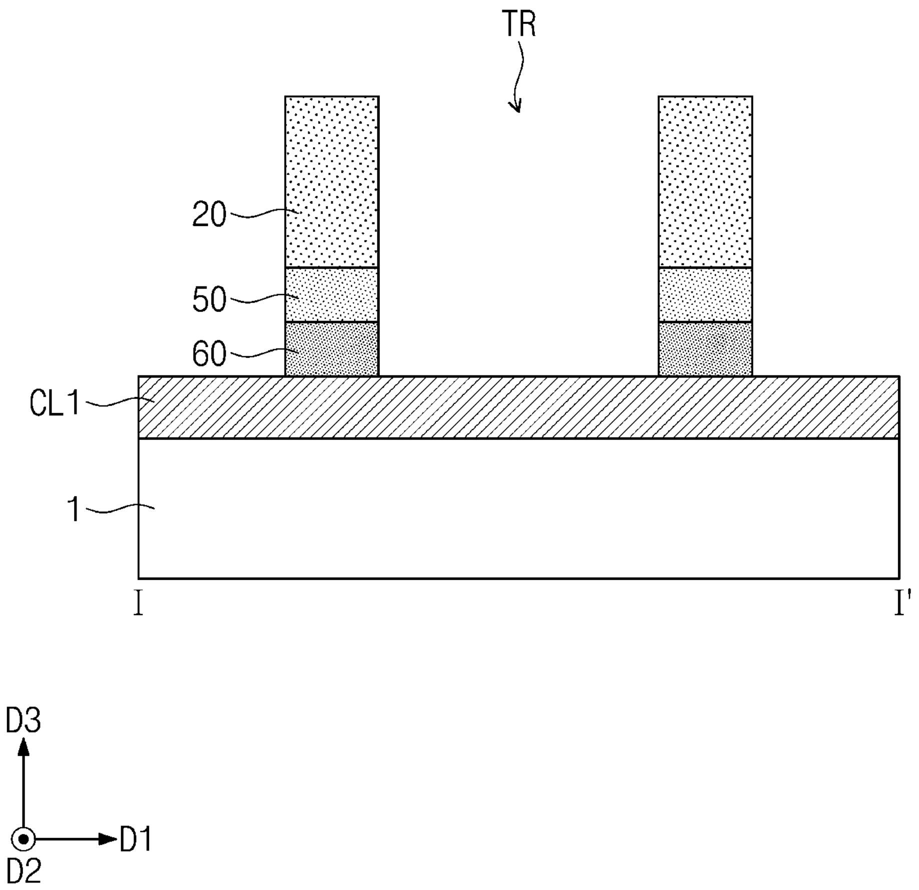

Referring to FIGS. 1 and 5C, a first dielectric pattern 20, a blocking pattern 50, and a lower pattern 60 may be formed on the first conductive line CL1. The first dielectric pattern 20, the blocking pattern 50, and the lower pattern 60 may each be formed in plural. The formation of the first dielectric pattern 20, the blocking pattern 50, and the lower pattern 60 may include using the mask pattern MP of FIG. 5B as an etching mask to etch the first dielectric layer 25, the blocking layer 55, and the lower layer 65. Therefore, the first dielectric pattern 20 and the blocking pattern 50 may vertically overlap the mask pattern MP of FIG. 5B.

The first dielectric pattern 20, the blocking pattern 50, and the lower pattern 60 may have a trench region TR, and the trench region TR may vertically overlap the mask trench MTR of FIG. 5B. The trench region TR may externally expose lateral surfaces of the first dielectric pattern 20, lateral surfaces of the blocking pattern 50, lateral surfaces of the lower pattern 60, and a portion of a top surface of the first conductive line CL1.

Figure 5D:
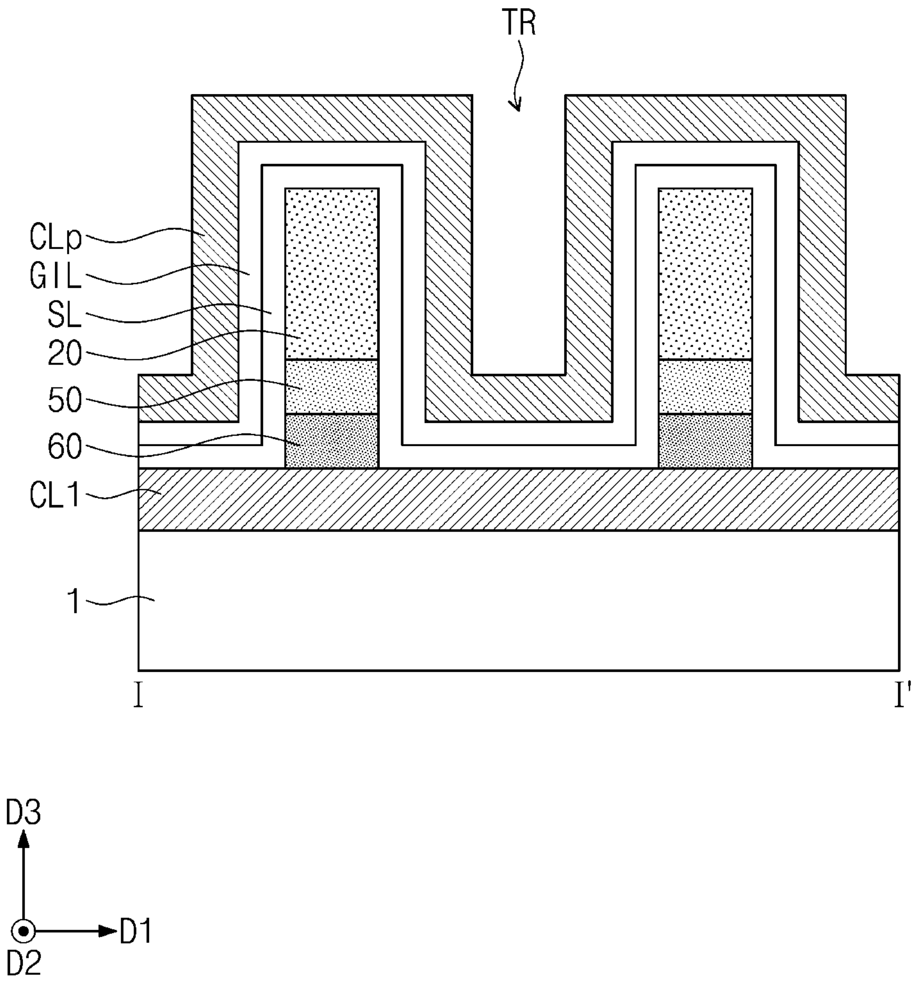

Referring to FIGS. 1 and 5D, a semiconductor layer SL, a gate dielectric layer GIL, and a second conductive layer CLp may be formed to entirely cover the top surface of the substrate 1. The semiconductor layer SL, the gate dielectric layer GIL, and the second conductive layer CLp may conformally cover the lateral surfaces of the first dielectric pattern 20, the lateral surfaces of the blocking pattern 50, the lateral surfaces of the lower pattern 60, and the portion of the top surface of the first conductive line CL1, which are exposed by the trench region TR. The semiconductor layer SL, the gate dielectric layer GIL, and the second conductive layer CLp may fill a portion of the trench region TR.

For example, as shown in FIG. 5D, after the formation of the semiconductor layer SL, the semiconductor layer SL may cover a top surface of the first dielectric pattern 20. In this step, the gate dielectric layer GIL and the second conductive layer CLp may cover the semiconductor layer SL on the top surface of the first dielectric pattern 20.

In an embodiment, although not shown, after the formation of the semiconductor layer SL, the semiconductor layer SL on the top surface of the first dielectric pattern 20 may be removed before the formation of the gate dielectric layer GIL and the second conductive layer CLp. In this case, a semiconductor pattern SP of FIG. 4 may be formed due to the removal of the semiconductor layer SL on the top surface of the first dielectric pattern 20, and the gate dielectric layer GIL and the second conductive layer CLp may cover a top surface of the semiconductor pattern SP of FIG. 4. For example, the gate dielectric layer GIL may contact the top surface of the semiconductor pattern SP of FIG. 4, and the second conductive layer CLp may be disposed on the gate dielectric layer GIL.

Referring to FIGS. 1 and 4, a semiconductor pattern SP, a gate dielectric pattern Gox, and a second conductive line CL2 may be formed. The formation of the semiconductor pattern SP, the gate dielectric pattern Gox, and the second conductive line CL2 may include patterning the semiconductor layer SL, the gate dielectric layer GIL, and the second conductive layer CLp on the top surface of the first dielectric pattern 20 to be divided into a plurality of semiconductor patterns SP, a plurality of gate dielectric patterns Gox, and a plurality of second conductive lines CL2, respectively.

The semiconductor pattern SP may include a first vertical part V1 and a second vertical part V2. The first dielectric pattern 20, the blocking pattern 50, and the lower pattern 60 may be interposed between an outer lateral surface V1*b* of the first vertical part V1 included in the semiconductor pattern SP and an outer lateral surface V2*b* of the second vertical part V2 included in a neighboring semiconductor pattern SP. The lower pattern 60 may be disposed adjacent to a lower portion of the first vertical part V1 and a lower portion of the second vertical part V2.

Thereafter, a second dielectric pattern 30 may be formed between the first sub-conductive line CL2*a* and the second sub-conductive line CL2*b*. The second dielectric pattern 30 may fill the trench region TR.

Figure 6:
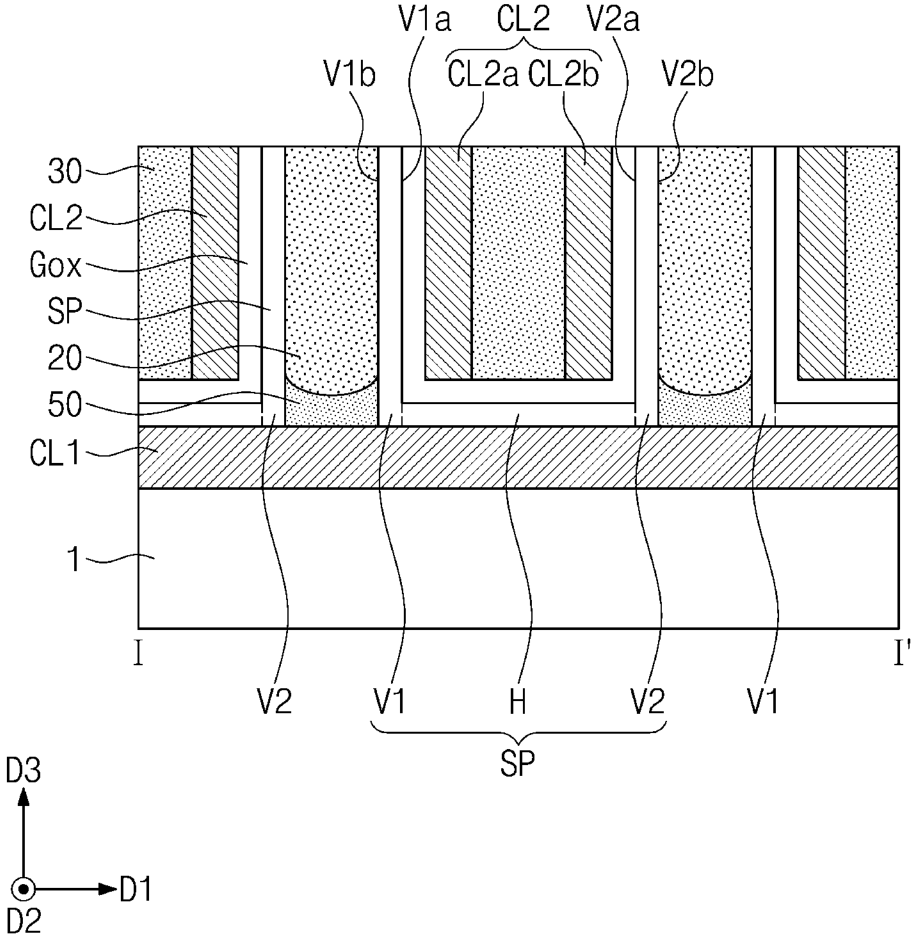
FIG. 6 illustrates a cross-sectional view taken along line I-I' of FIG. 1.

FIG. 6 illustrates a cross-sectional view taken along line I-I' of FIG. 1. For brevity of description, a repetitive description will be omitted.

Referring to FIGS. 1 and 6, a top surface of the blocking pattern 50 may have a profile that is recessed toward the first conductive line CL1. The top surface of the blocking pattern 50 may have a curved profile (i.e., a concave surface) that is recessed toward a bottom surface of the blocking pattern 50. For example, a thickness in the third direction D3 of the blocking pattern 50 may be the largest at a location near adjacent semiconductor patterns SP. The thickness of the blocking pattern 50 may be the smallest in the vicinity of a middle location between the adjacent semiconductor patterns SP.

FIGS. 7A to 7D illustrate cross-sectional views showing a method of fabricating the semiconductor device as depicted in FIG. 6. With reference to FIGS. 1 and 7A to 7D, the following will describe a method of fabricating the semiconductor device as depicted in FIG. 6. For brevity of description, a repetitive description will be omitted.

Figure 7A:
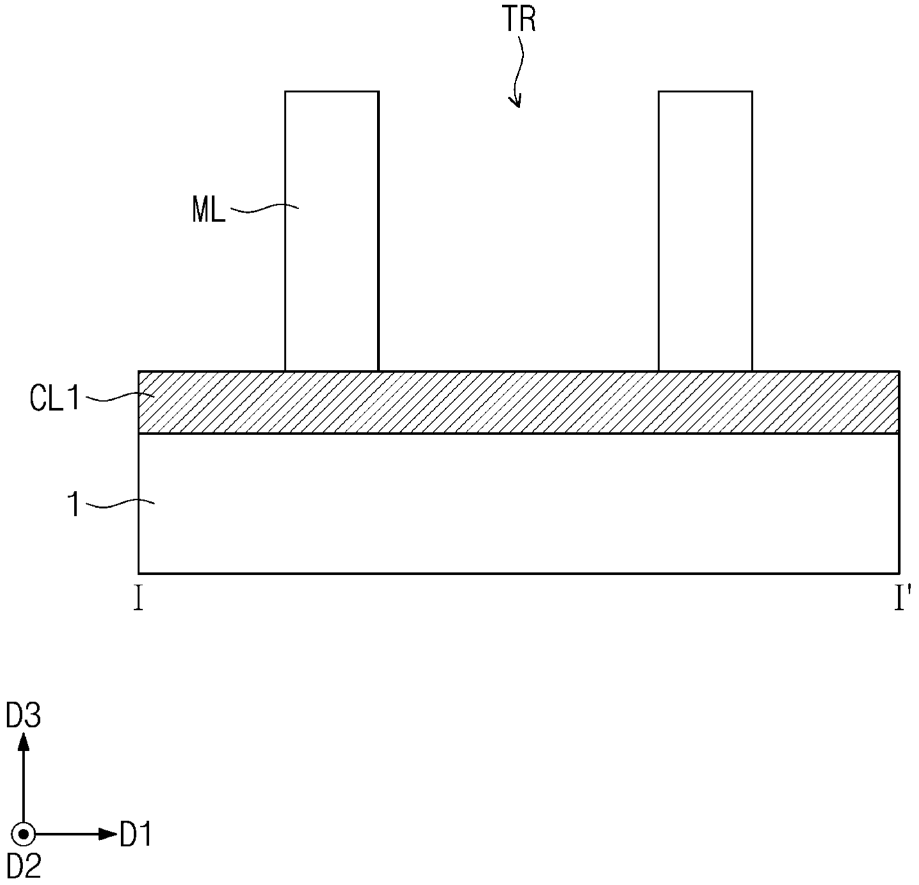
FIGS. 7A to 7D illustrate cross-sectional views showing a method of fabricating the semiconductor device as depicted in FIG. 6.

Referring to FIGS. 1 and 7A, a first conductive line CL1 may be formed on a substrate 1, and a mold pattern ML may be formed on the first conductive line CL1. The formation of the mold pattern ML may include depositing a mold layer (not shown) on the substrate 1, and patterning the mold layer to form the mold pattern ML. The mold pattern ML may include line patterns that extend in the second direction D2 and are spaced apart from each other in the first direction D1. The mold pattern ML may have a first trench region TR1, and the first trench region TR1 may be provided in plural. The first trench regions TR1 may be spaced apart from each other in the first direction D1 and may extend in the second direction D2. The first trench region TR1 may externally expose a portion of a top surface of the first conductive line CL1.

Figure 7B:
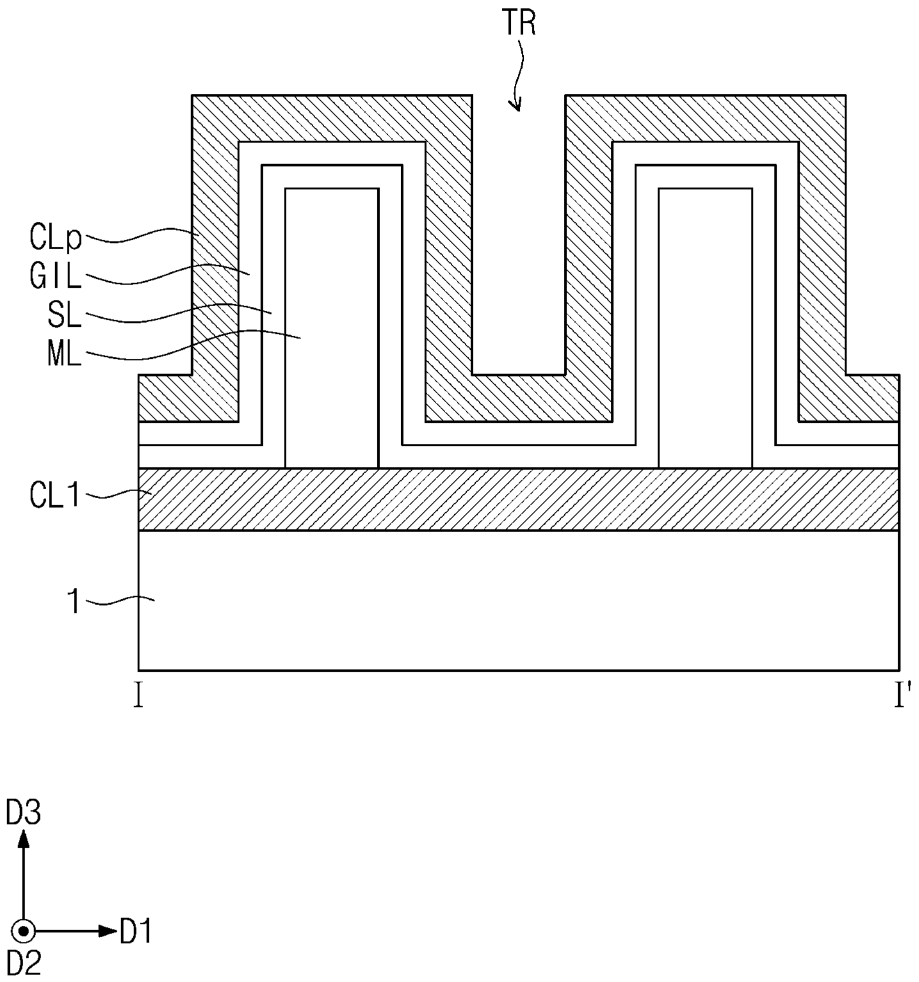

Referring to FIGS. 1 and 7B, a semiconductor layer SL, a gate dielectric layer GIL, and a second conductive layer CLp may be formed to entirely cover a top surface of the substrate 1. The semiconductor layer SL, the gate dielectric layer GIL, and the second conductive layer CLp may conformally cover lateral surfaces of the mold pattern ML and a portion of the top surface of the first conductive line CL1 exposed by the first trench region TR1. The semiconductor layer SL, the gate dielectric layer GIL, and the second conductive layer CLp may fill a portion of the first trench region TR1.

For example, as shown in FIG. 7B, after the formation of the semiconductor layer SL, the gate dielectric layer GIL and the second conductive layer CLp may cover the semiconductor layer SL on a top surface of the mold pattern ML. In an embodiment, although not shown, after the formation of the semiconductor layer SL, the semiconductor layer SL on the top surface of the mold pattern ML may be removed before the formation of the gate dielectric layer GIL and the second conductive layer CLp. In this case, a semiconductor pattern SP of FIG. 7C may be formed due to the removal of the semiconductor layer SL on the top surface of the mold pattern ML, and the gate dielectric layer GIL and the second conductive layer CLp may cover the semiconductor pattern SP of FIG. 7C.

Figure 7C:
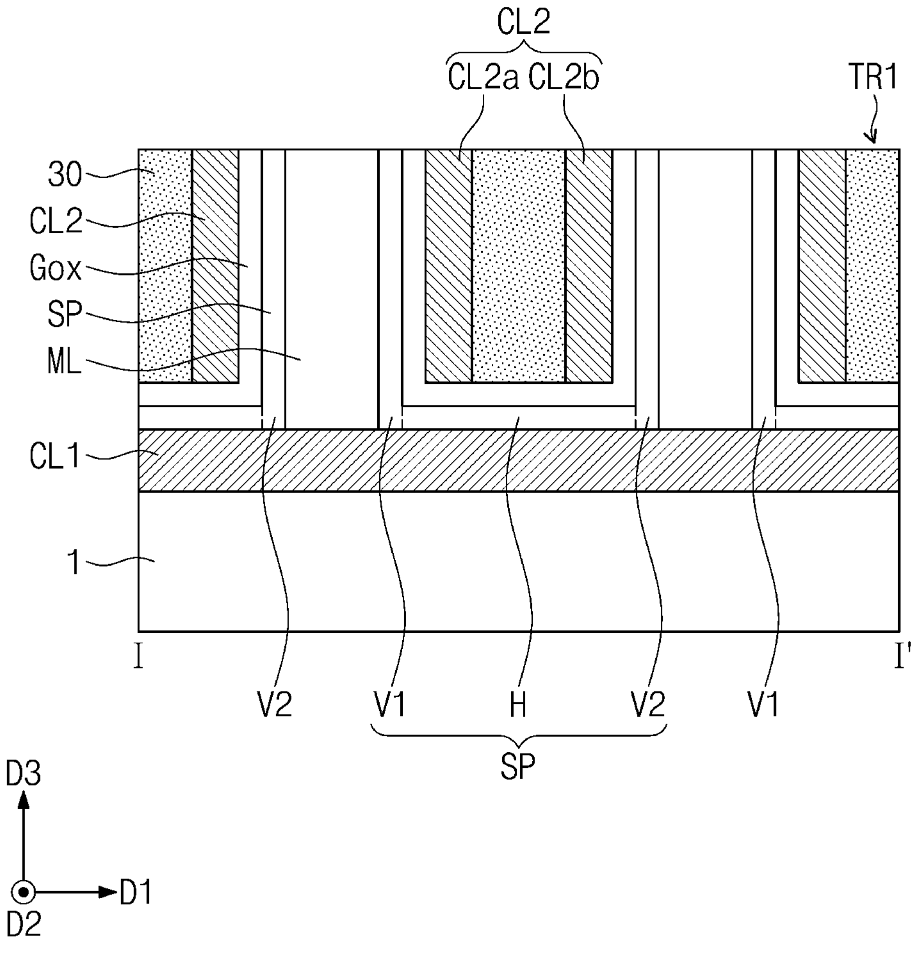

Referring to FIGS. 1 and 7C, a semiconductor pattern SP, a gate dielectric pattern Gox, and a second conductive line CL2 may be formed. The formation of the semiconductor pattern SP, the gate dielectric pattern Gox, and the second conductive line CL2 may include patterning the semiconductor layer SL, the gate dielectric layer GIL, and the second conductive layer CLp on the top surface of the mold pattern ML to be divided into a plurality of semiconductor patterns SP, a plurality of gate dielectric patterns Gox, and a plurality of second conductive lines CL2, respectively. The second conductive line CL2 may include a first sub-conductive line CL2*a* and a second sub-conductive line CL2*b*.

Afterwards, a second dielectric pattern 30 may be formed between the first sub-conductive line CL2*a* and the second sub-conductive line CL2*b*. The second dielectric pattern 30 may fill the first trench region TR1. After the formation of the second dielectric pattern 30, the top surface of the mold pattern ML may be externally exposed.

Figure 7D:
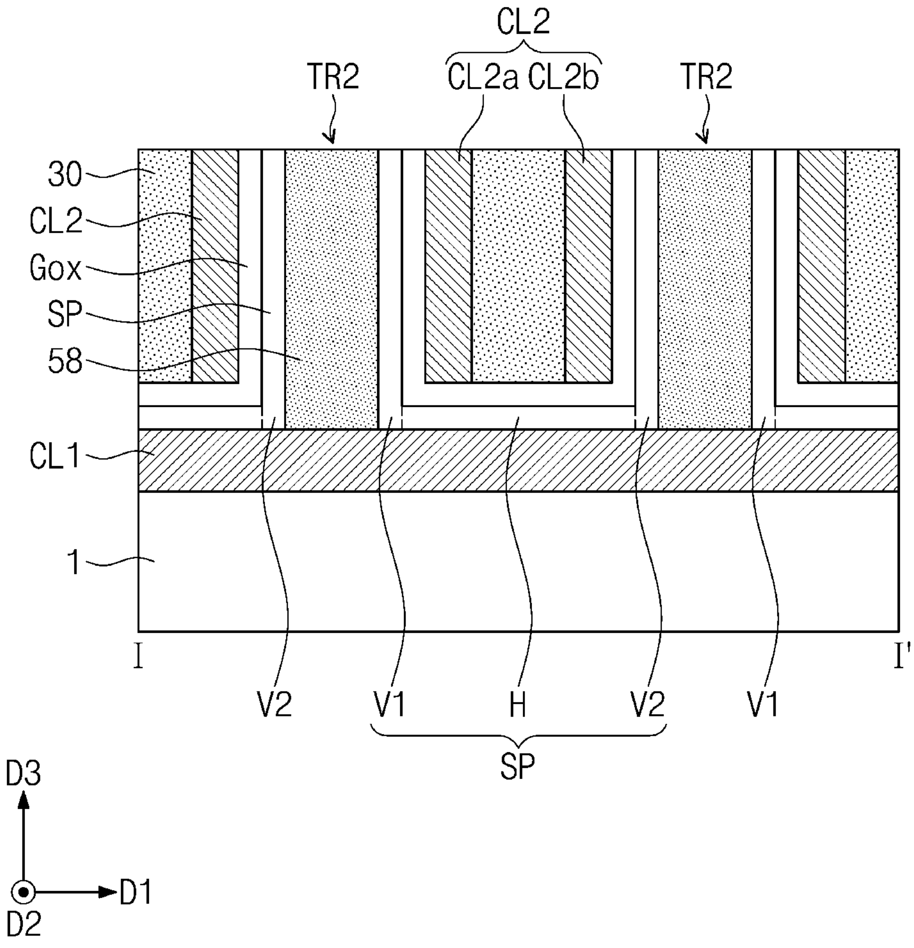

Referring to FIGS. 1 and 7D, the mold pattern ML may be removed. A second trench region TR2 may be formed at an area where the mold pattern ML is removed, and the second trench region TR2 may be provided in plural.

Thereafter, a preliminary blocking pattern 58 may be formed to fill the second trench region TR2. The preliminary blocking pattern 58 may include or may be formed of at least one selected from a dielectric material and a conductive material. The dielectric material may include, for example, at least one selected from silicon nitride (e.g., SiNx) and metal oxide (e.g., AlOx). The conductive material may include, for example, a metallic material.

Referring to FIGS. 1 and 6, a blocking pattern 50 may be formed in the second trench region TR2. The blocking pattern 50 may be formed in each of lower portions of the second trench regions TR2. The formation of the blocking pattern 50 may include removing an upper portion of the preliminary blocking pattern 58. The removal may include isotropically etching the upper portion of the preliminary blocking pattern 58. The isotropic etching process may allow a top surface of the blocking pattern 50 to have a profile that is recessed toward the first conductive line CL1. The top surface of the blocking pattern 50 may have a curved profile that is recessed toward a bottom surface of the blocking pattern 50.

Afterwards, a first dielectric pattern 30 may be formed on the blocking pattern 50. The first dielectric pattern 30 may be formed to fill an unoccupied portion of the second trench region TR2. The blocking pattern 50 may vertically separate the first dielectric pattern 30 from the first conductive line CL1.

Figure 8:
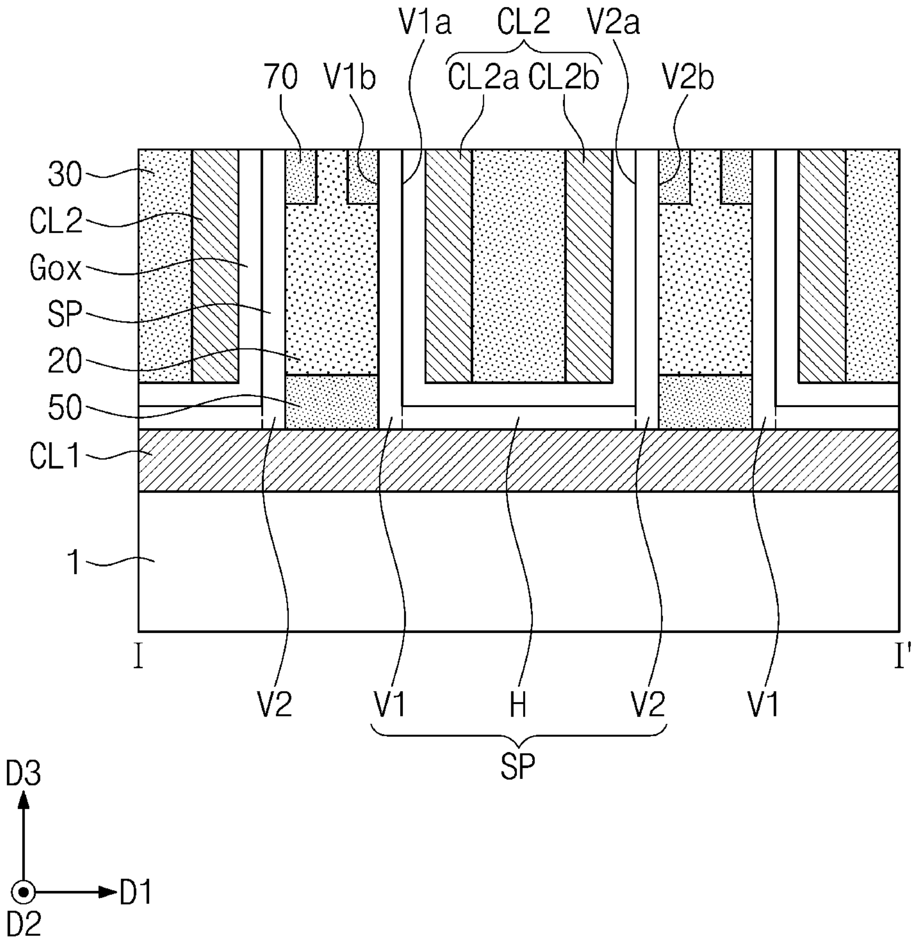
FIG. 8 illustrates a cross-sectional view taken along line I-I' of FIG. 1.

FIG. 8 illustrates a cross-sectional view taken along line I-I' of FIG. 1. For brevity of description, a repetitive description will be omitted.

Referring to FIGS. 1 and 8, an upper pattern 70 may be provided adjacent to upper portions of the first and second vertical parts V1 and V2 included in the semiconductor pattern SP. The upper pattern 70 may be provided in plural. The upper pattern 70 may be provided on the outer lateral surface V1*b* of the first vertical part V1 and the outer lateral surface V2*b* of the second vertical part V2. The upper pattern 70 may separate the first dielectric pattern 20 from the upper portions of the first and second vertical parts V1 and V2. In this configuration, the upper portions of the first and second vertical parts V1 and V2 may be prevented from oxidation caused by oxygen (O) of the first dielectric pattern 20. Therefore, there may be a reduction in contact resistance between the semiconductor pattern SP and an electrode (not shown) connected thereto, and as a result, the reliability and electrical properties of a semiconductor device may be improved.

Figure 9:
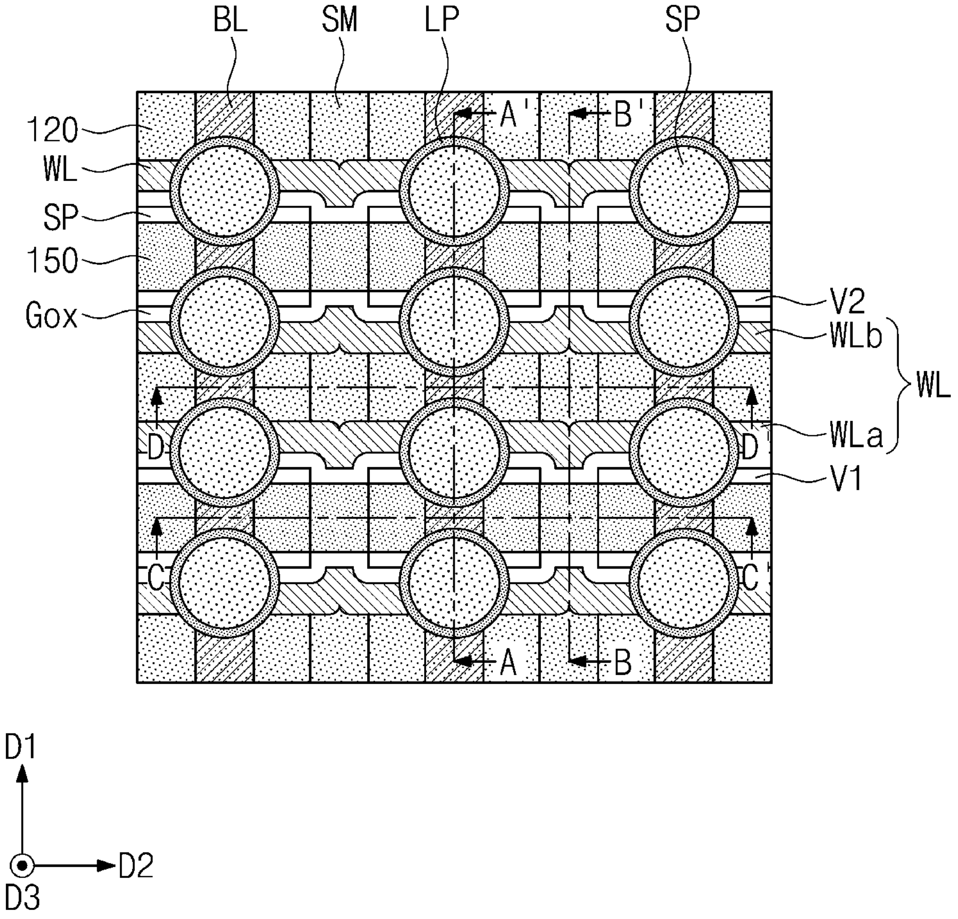
FIG. 9 illustrates a plan view showing a semiconductor device according to some embodiments of the present inventive concepts.
Figure 10A:
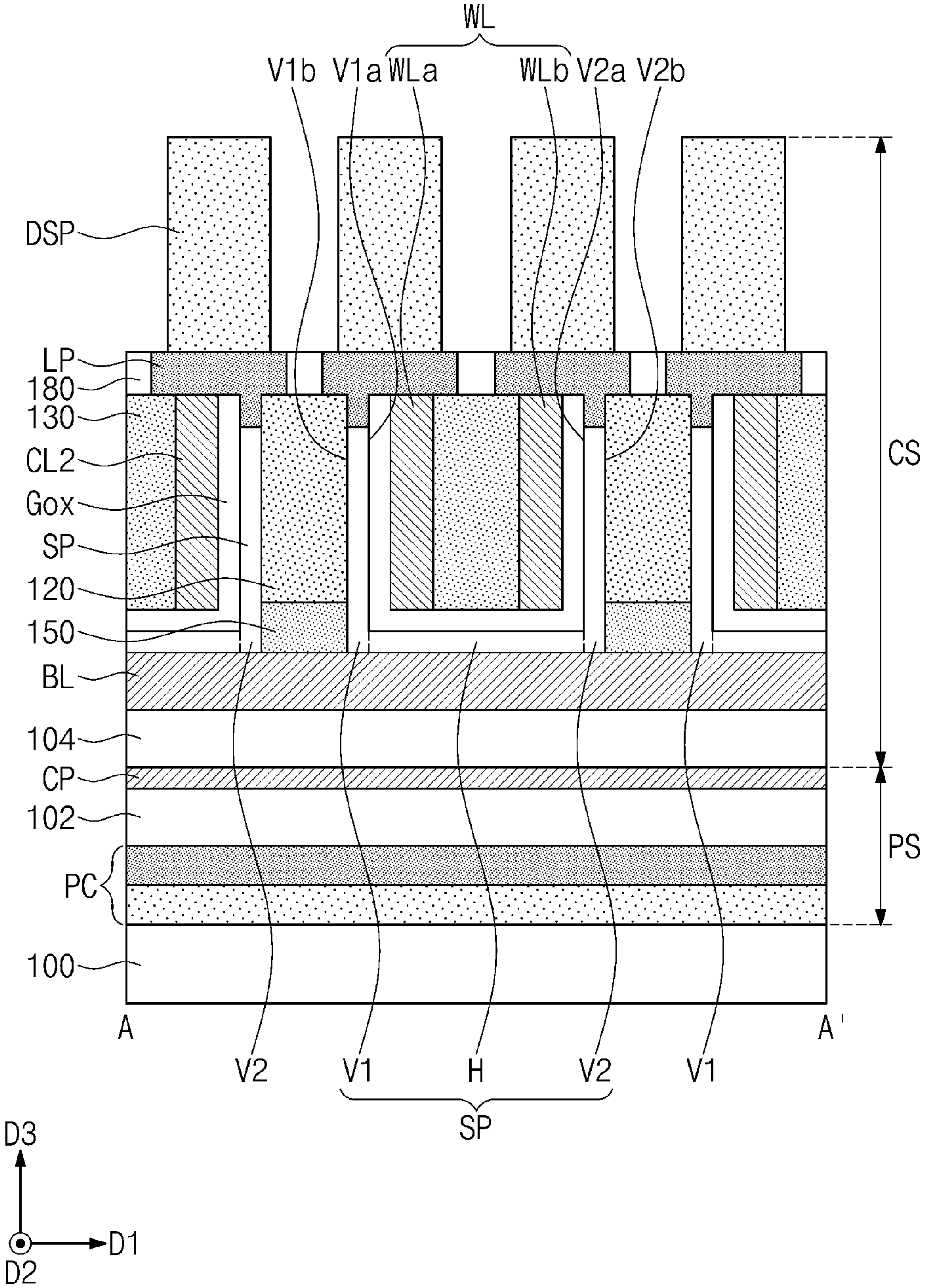
FIGS. 10A, 10B, 10C, and 10D illustrate cross-sectional views respectively taken along lines A-A', B-B', C-C', and D-D' of FIG. 9.
Figure 10B:
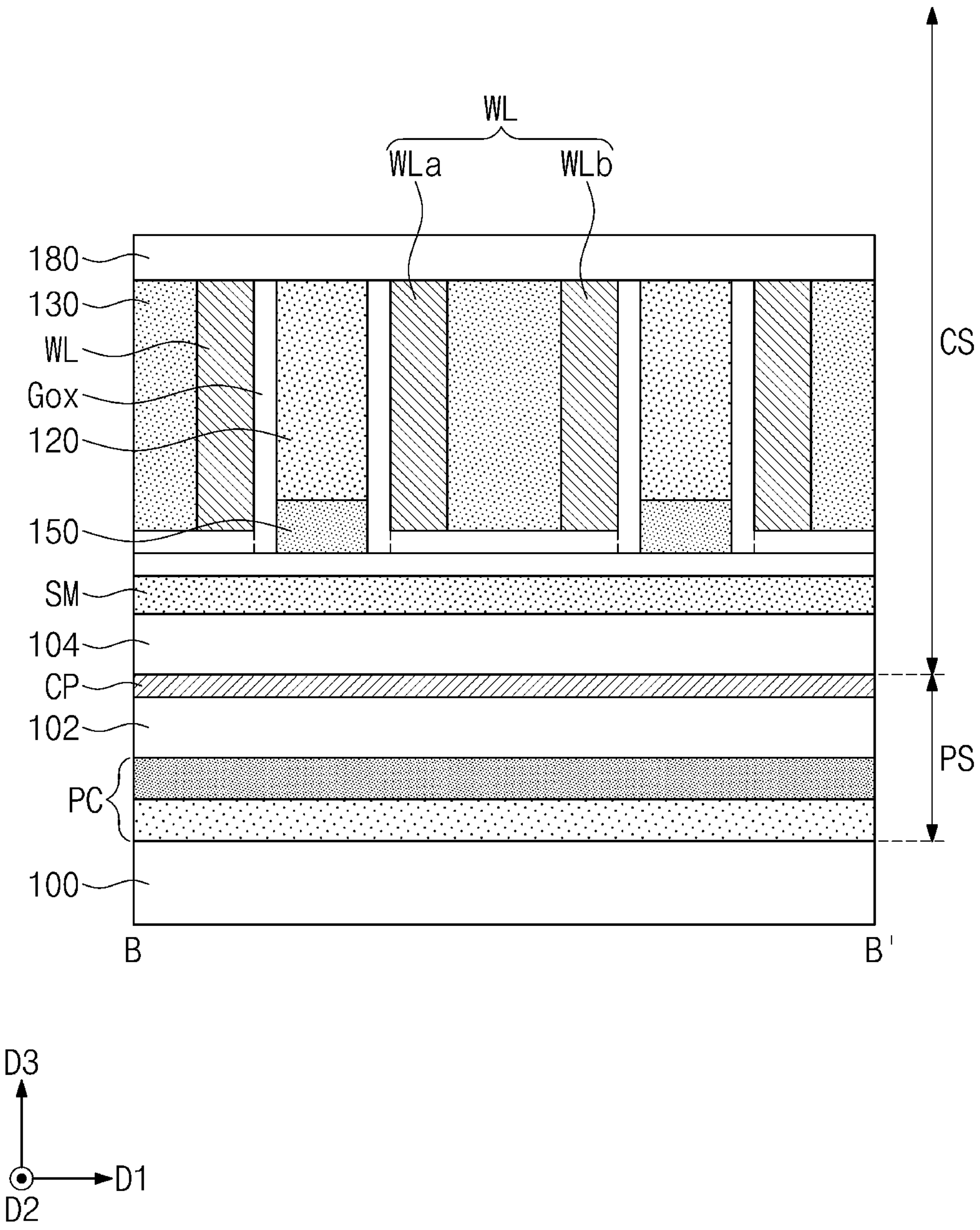
Figure 10C:
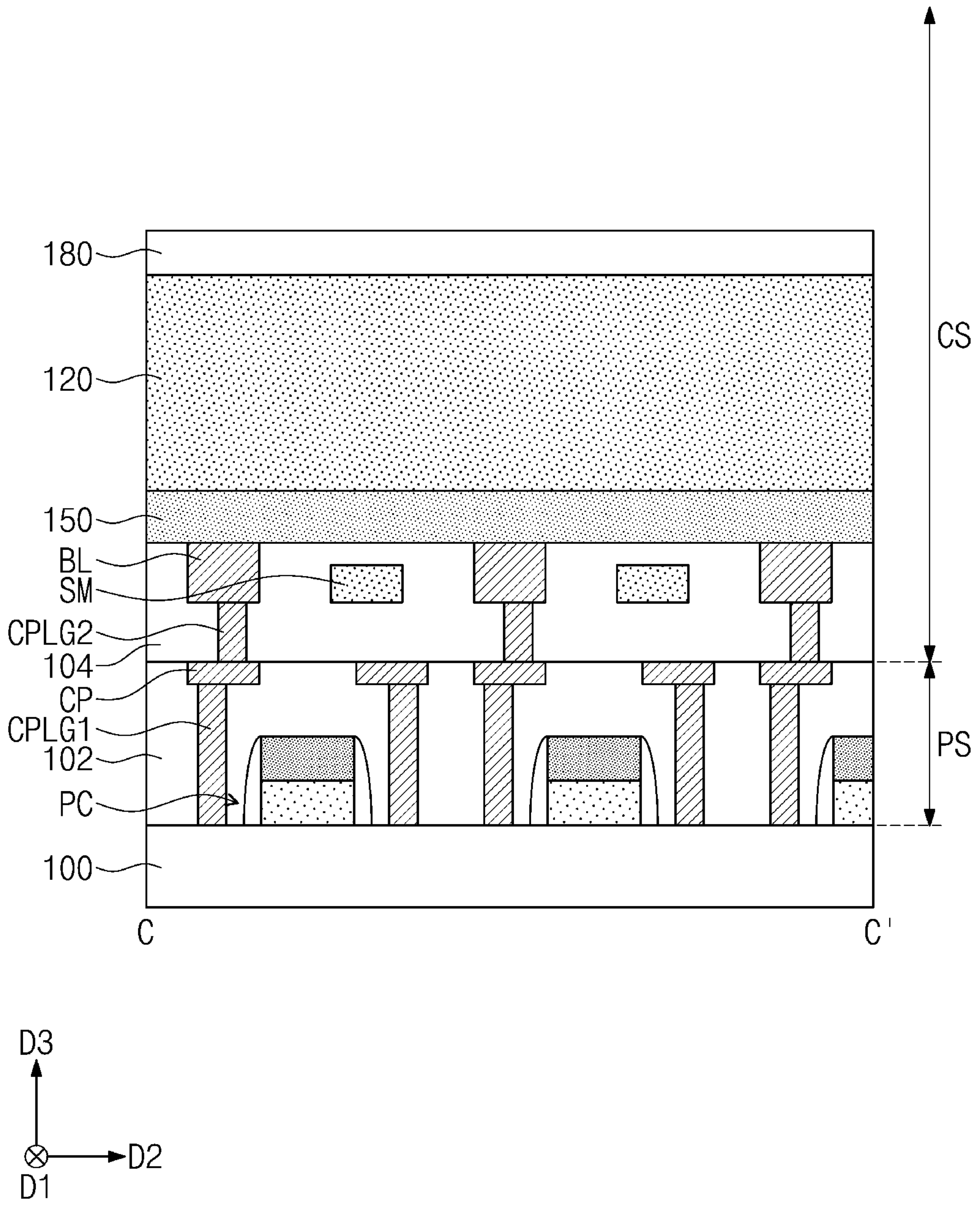
Figure 10D:
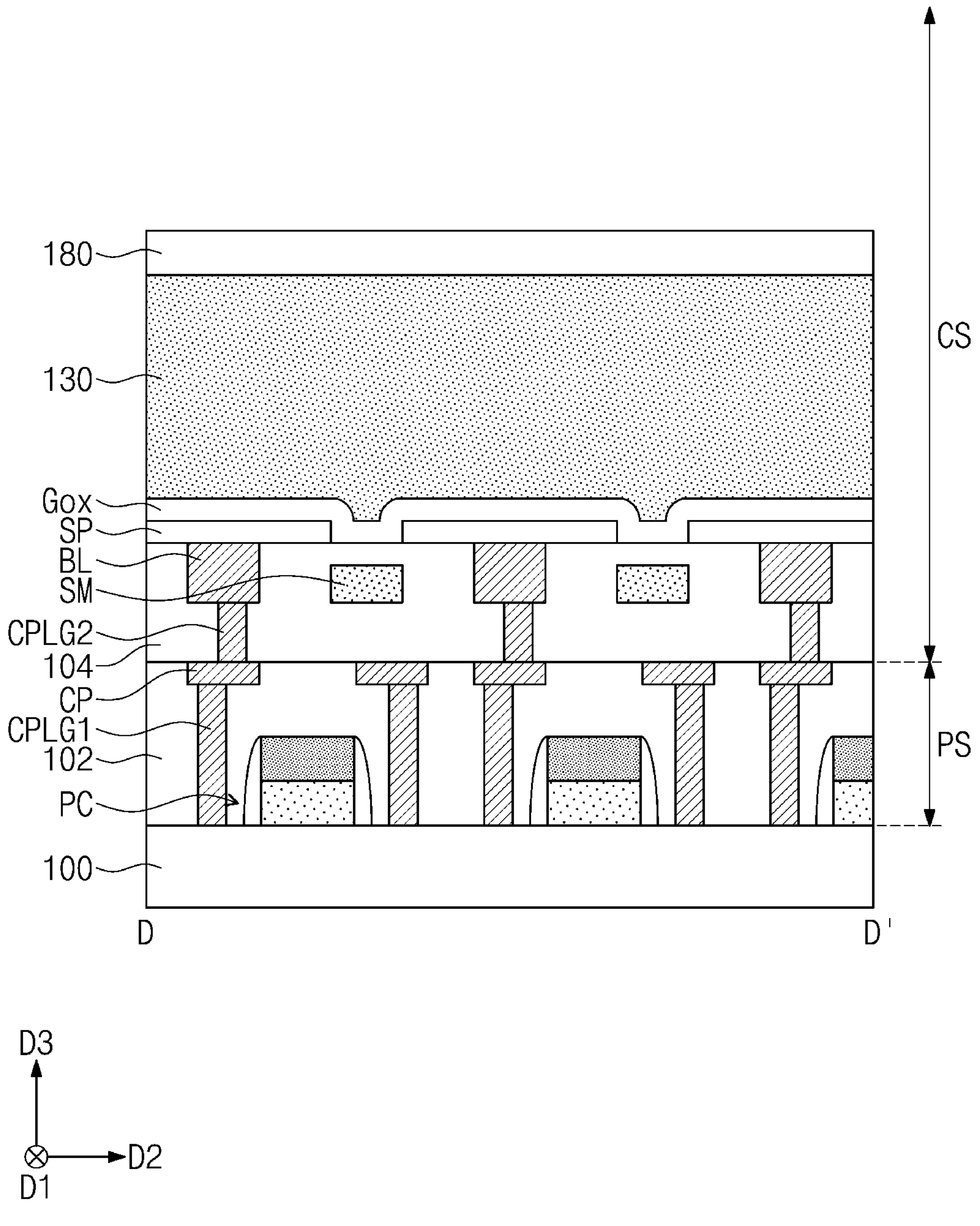

FIG. 9 illustrates a plan view showing a semiconductor device according to some example embodiments of the present inventive concepts. FIGS. 10A to 10D illustrate cross-sectional views respectively taken along lines A-A', B-B', C-C', and D-D' of FIG. 9. For brevity of description, a repetitive description will be omitted.

Referring to FIGS. 9 and 10A to 10D, a semiconductor device according to some embodiments of the present inventive concepts may include a substrate 100, a peripheral circuit structure PS on the substrate 100, and a cell array structure CS on the peripheral circuit structure PS. The substrate 100, the peripheral circuit structure PS, and a portion of the cell array structure CS may correspond to the substrate 1 of FIG. 2.

The peripheral circuit structure PS may include a peripheral gate structure PC, peripheral contact pads CP, and peripheral contact plugs CPLG1 that are integrated on the substrate 100, and may also include a first interlayer dielectric layer 102 that covers the peripheral gate structure PC, the peripheral contact pads CP, and the peripheral contact plugs CPLG1.

The cell array structure CS may include memory cells including vertical channel transistors (VCT). The vertical channel transistor may indicate a structure in which a channel length extends in a third direction D3. The cell array structure CS may include a plurality of cell contact plugs CPLG2, a plurality of bit lines BL, a plurality of shield metals SM, a second interlayer dielectric layer 104, a plurality of semiconductor patterns SP, a plurality of blocking patterns 150, a plurality of word lines WL, a plurality of gate dielectric patterns Gox, and a plurality of data storage patterns DSP. The bit line BL may correspond to the first conductive line CL1 of FIG. 2, and the word line WL may correspond to the second conductive line CL2 of FIG. 2. The second interlayer dielectric layer 104 may cover the cell contact plugs CPLG2 and the shield metals SM.

For example, the peripheral gate structures PC of the peripheral circuit structure PS may be electrically connected to the bit lines BL through the peripheral contact plugs CPLG1, the peripheral contact pads CP, and the cell contact plugs CPLG2. Each of the first and second interlayer dielectric layers 102 and 104 may be a multiple dielectric layer, and may include or may be formed of at least one selected from silicon oxide, silicon nitride, silicon oxynitride, and low-k dielectric.

The bit lines BL may extend in a first direction D1 and may be spaced apart from each other in a second direction D2. The second interlayer dielectric layer 104 may fill a space between neighboring bit lines BL. The bit lines BL may include, for example, at least one selected from doped polysilicon, metal (e.g., Al, Cu, Ti, Ta, Ru, W, Mo, Pt, Ni, or Co), conductive metal nitride (e.g., TiN, TaN, WN, NbN, TiAlN, TiSiN, TaSiN, or RuTiN), conductive metal silicide, and conductive metal oxide (e.g., PtO, $RuO_2$, $IrO_2$, SRO ($SrRuO_3$), BSRO($(Ba,Sr)RuO_3$), CRO($CaRuO_3$), or LSCo), but the present inventive concepts are not limited thereto. The bit lines BL may include a single or multiple layer of the materials mentioned above. In some embodiments, the bit lines BL may include a two-dimensional semiconductor material, such as graphene, carbon nano-tube, and any combination thereof.

The semiconductor patterns SP may be disposed on the bit lines BL, and may be spaced apart from each other in the first and second directions D1 and D2. Each of the semiconductor patterns SP may include a first vertical part V1 and a second vertical part V2 that are opposite to each other. An inner lateral surface V1*a* of the first vertical part V1 may face, in the first direction D1, an inner lateral surface V2*a* of the second vertical part V2. An outer lateral surface V1*b* of the first vertical part V1 may face, in the first direction D1, an outer lateral surface V2*b* of the second vertical part V2 of the semiconductor pattern SP that is adjacent in the first direction D1 to outer lateral surface V1*b* of the first vertical part V1. According to an embodiment, the semiconductor pattern SP may further include a horizontal part H that connects the first and second vertical parts V1 and V2 with each other. The horizontal part H may connect lower portions of the first and second vertical parts V1 and V2 with each other. The horizontal part H may contact a corresponding bit line BL.

The semiconductor pattern SP may include or may be formed of an oxide semiconductor, for example, at least one selected from $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, and $In_xGa_yO$. For example, the semiconductor pattern SP may include or may be formed of indium-gallium-zinc oxide (IGZO). The semiconductor pattern SP may have a single or multiple layer of the oxide semiconductor. The present inventive concepts are not limited thereto. In an embodiment, the semiconductor pattern SP may include or may be formed of an amorphous, crystalline, or polycrystalline oxide semiconductor. In some embodiments, the semiconductor pattern SP may have a bandgap energy greater than that of silicon. For example, the semiconductor pattern SP may have a bandgap energy selected from a range of about 1.5 eV to about 5.6 eV. The semiconductor pattern SP may have desirable channel performance when its bandgap energy has a value selected from a range of about 2.0 eV to about 4.0 eV. The semiconductor pattern SP may be a polycrystalline or amorphous, but the present inventive concepts are not limited thereto. In some embodiments, the semiconductor pattern SP may include or may be formed of a two-dimensional semiconductor material, such as graphene, carbon nano-tube, and any combination thereof.

First dielectric patterns 120 may be disposed between neighboring semiconductor patterns SP. The first dielectric patterns 120 may extend in the second direction D2 and may be spaced apart from each other in the first direction D1. Each of the second dielectric patterns 130 may be disposed between the first and second vertical parts V1 and V2 of each semiconductor pattern SP. The second dielectric patterns 130 may extend in the second direction D2 and may be spaced apart from each other in the first direction D1. The first and second dielectric patterns 120 and 130 may include or may be formed of at least one selected from silicon oxide, silicon oxynitride, and low-k dielectric.

The blocking patterns 150 may be interposed between neighboring semiconductor patterns SP and between the bit lines BL and the first dielectric patterns 120. Each of the blocking patterns 150 may be interposed between the outer lateral surface V1*b* of the first vertical part V1 included in one of the neighboring semiconductor patterns SP and the outer lateral surface V2*b* of the second vertical part V2 included in another of the neighboring semiconductor patterns SP. On the bit lines BL, the blocking pattern 150 may be disposed adjacent to lower portions of the neighboring semiconductor patterns SP. The blocking patterns 150 may cover portions, not covered with the semiconductor patterns SP, of the bit lines BL. For example, the blocking patterns 50 may extend in the second direction D2 and may be spaced apart from each other in the first direction D1.

The blocking patterns 50 may vertically separate the first dielectric patterns 20 from the bit lines BL, and may not allow the first dielectric patterns 20 to contact lower portions of the first and second vertical parts V1 and V2 of the semiconductor patterns SP.

The blocking pattern 50 may include or may be formed of at least one selected from a dielectric material and a conductive material. The dielectric material may include, for example, at least one selected from silicon nitride (e.g., SiNx) and metal oxide (e.g., AlOx). The conductive material may include, for example, a metallic material.

The word lines WL may extend in the second direction D2 and may be spaced apart from each other in the first direction D1. Each of the word lines WL may be disposed between the first and second vertical parts V1 and V2 of each semiconductor pattern SP. Each of the word lines WL may include a first sub-word line WLa and a second sub-word line WLb. The first sub-word line WLa may be interposed between the first vertical part V1 of a corresponding semiconductor pattern SP and a corresponding second dielectric pattern 130, and may be disposed on the inner lateral surface V1*a* of the first vertical part V1. The second sub-word line WLb may be interposed between the second vertical part V2 of the corresponding semiconductor pattern SP and the corresponding second dielectric pattern 130, and may be disposed on the inner lateral surface V2*a* of the second vertical part V2. For the convenience of description, a pair of word lines between the first vertical part V1 and the second vertical part V2 are referred to as first and second sub-word lines WLa and WLb. The first and second sub-word lines WLa and WLb may be independently driven by a word line driver in a peripheral circuit. In other words, each of the first and second sub-word lines WLa and WLb may be a word line of a plurality of word lines that are independently driven. However, the first and second sub-word lines WLa and WLb may be driven together in a test operation.

The word lines WL may include, for example, at least one selected from doped polysilicon, metal (e.g., Al, Cu, Ti, Ta, Ru, W, Mo, Pt, Ni, or Co), conductive metal nitride (e.g., TiN, TaN, WN, NbN, TiAlN, TiSiN, TaSiN, or RuTiN), conductive metal silicide, and conductive metal oxide (e.g., PtO, $RuO_2$, $IrO_2$, SRO($SrRuO_3$), BSRO($(Ba,Sr)RuO_3$), CRO($CaRuO_3$), or LSCo), but the present inventive concepts are not limited thereto. The word lines WL may have a single or multiple layer of the materials mentioned above. In some embodiments, the word lines WL may include or may be formed of a two-dimensional semiconductor material, such as graphene, carbon nano-tube, and any combination thereof.

Each of the gate dielectric patterns Gox may be interposed between a corresponding semiconductor pattern SP and a corresponding word line WL. For example, each of the gate dielectric patterns Gox may be interposed between the inner lateral surface V1*a* of the first vertical part V1 included in the corresponding semiconductor pattern SP and the first sub-word line WLa of the corresponding word line WL, and between the inner lateral surface V2*a* of the second vertical part V2 included in the corresponding semiconductor pattern SP and the second sub-word line WLb of the corresponding word line WL. Each of the gate dielectric patterns Gox may further extend between the corresponding word line WL and the horizontal part H of the corresponding semiconductor pattern SP. The gate dielectric pattern Gox may separate the corresponding word line WL from the corresponding semiconductor pattern SP. The gate dielectric patterns Gox may have their uniform thicknesses that cover the semiconductor patterns SP.

The gate dielectric patterns Gox may include or may be formed of at least one selected from silicon oxide, silicon oxynitride, and a high-k dielectric material whose a dielectric constant is greater than that of silicon oxide. The high-k dielectric material may include metal oxide or metal oxynitride. For example, the high-k dielectric material used as the gate dielectric pattern Gox may include at least one selected from $HfO_2$, HfSiO, HfSiON, HfTaO, HfTiO, HfZrO, $ZrO_2$, $Al_2O_3$, and any combination thereof, but the present inventive concepts are not limited thereto.

Landing pads LP may be correspondingly provided on the first and second vertical parts V1 and V2 of the semiconductor patterns SP. The landing pads LP may contact and may be electrically connected to the first and second vertical parts V1 and V2. When viewed in a plan view, the landing pads LP may be spaced apart from each other in the first and second directions D1 and D2, and may be arranged in a matrix shape, a zigzag shape, a honeycomb shape, or any other suitable shape. When viewed in a plan view, the landing pads LP may each have a circular shape, an oval shape, a rectangular shape, a square shape, a rhombic shape, a hexagonal shape, or any other suitable shape.

The landing pads LP may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or any combination thereof, but the present inventive concepts are not limited thereto.

The first and second dielectric patterns 120 and 130 may be provided thereon with a third interlayer dielectric layer 180 that fills spaces between the landing pads LP. The third interlayer dielectric layer 180 may include or may be formed of, for example, at least one selected from silicon oxide, silicon nitride, and silicon oxynitride, and may have a single or multiple layer.

Data storage patterns DSP may be correspondingly provided on the landing pads LP. The data storage patterns DSP may be electrically connected through the landing pads LP to the first and second vertical parts V1 and V2 of the semiconductor patterns SP.

According to an embodiment, the data storage patterns DSP may be capacitors, each of which capacitors may include bottom and top electrodes, and a capacitor dielectric layer interposed between the bottom and top electrodes. In this case, the bottom electrode may contact the landing pad LP, and when viewed in a plan view, may have a circular shape, an oval shape, a rectangular shape, a square shape, a rhombic shape, a hexagonal shape, or any other suitable shape.

In an embodiment, the data storage patterns DSP may each be a variable resistance pattern that is switched from one to the other of its two resistance states by an applied electrical pulse. For example, the data storage patterns DSP may include a phase-change material whose crystalline state is changed based on an amount of current, perovskite compounds, transition metal oxide, magnetic materials, ferromagnetic materials, or antiferromagnetic materials.

Figure 11:
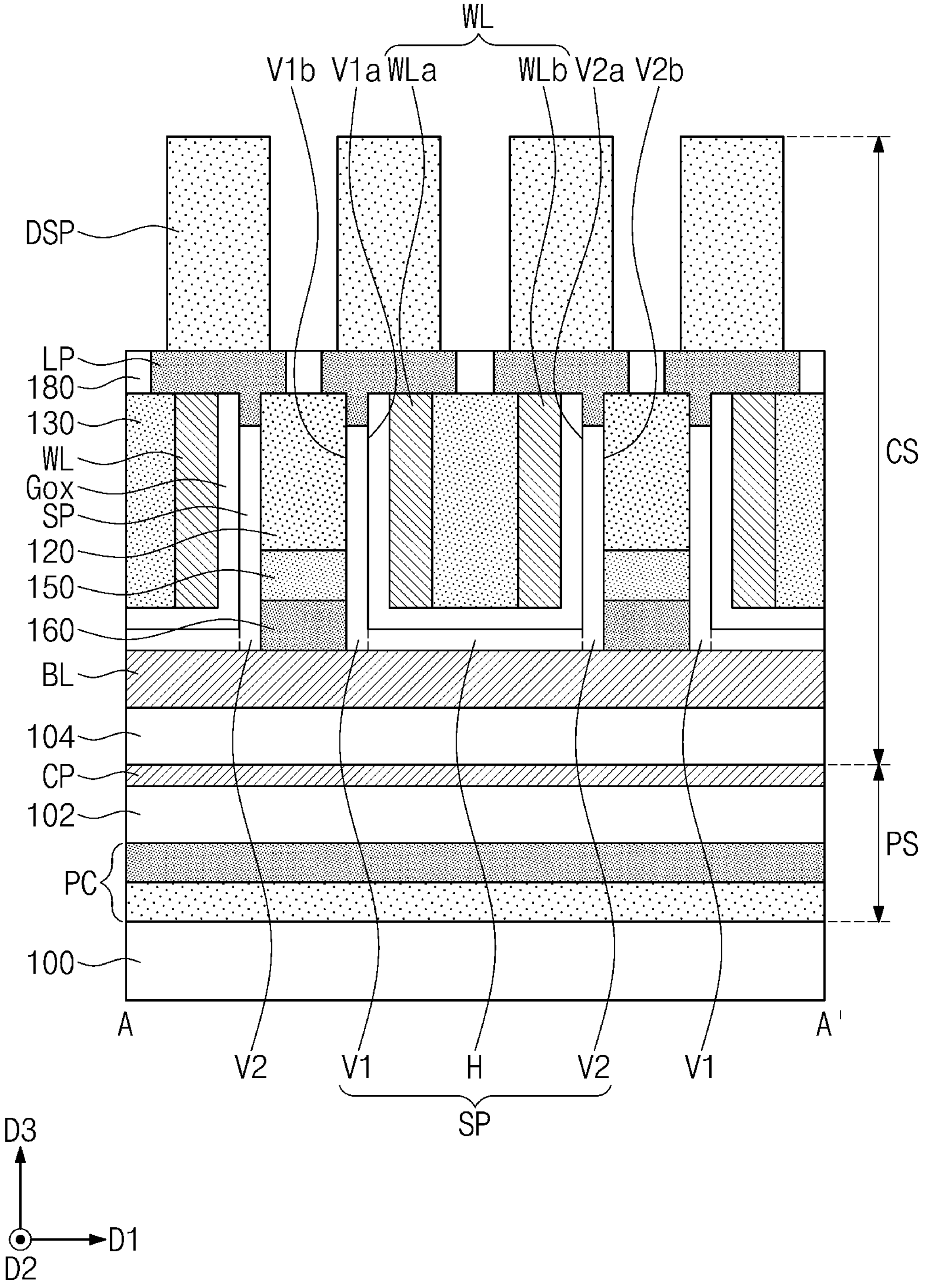
FIGS. 11 to 13 illustrate cross-sectional views taken along line A-A' of FIG. 9.
Figure 12:
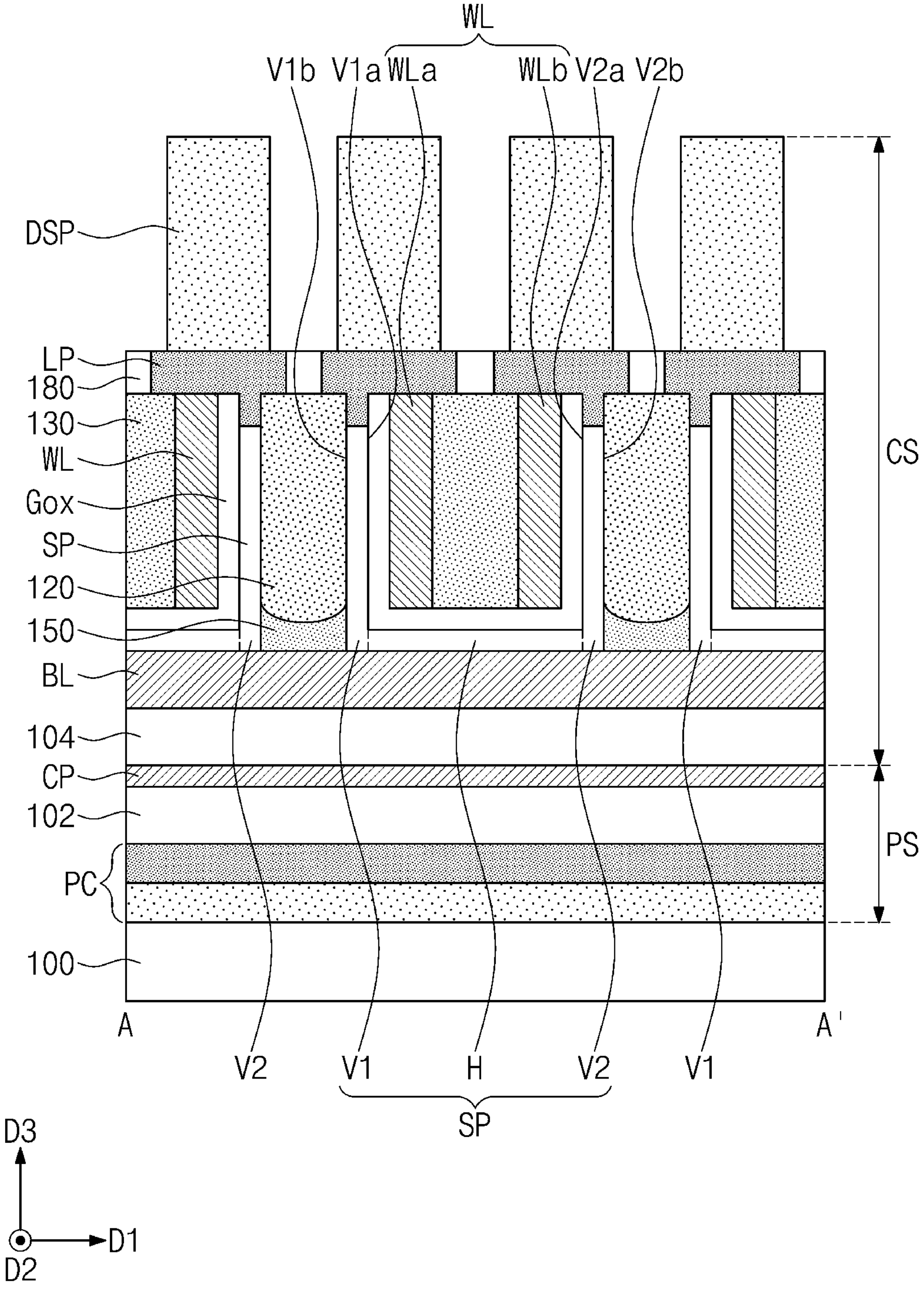
Figure 13:
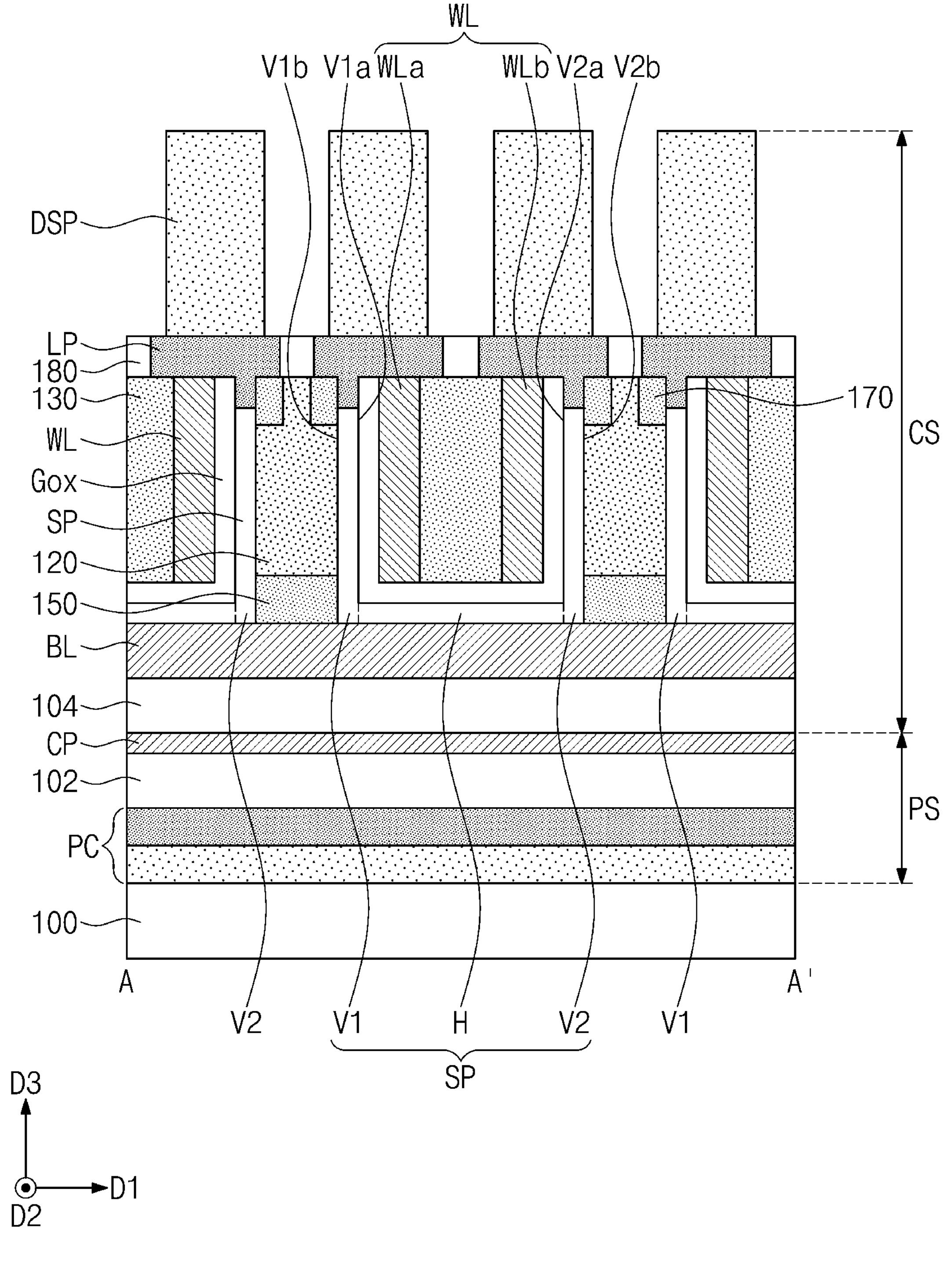

FIGS. 11 to 13 illustrate cross-sectional views taken along line A-A' of FIG. 9. For brevity of description, a repetitive description will be omitted.

Referring to FIGS. 9 and 11, lower patterns 160 may be arranged on the bit lines BL. The lower patterns 160 may be interposed between neighboring semiconductor patterns SP and between the bit lines BL and the blocking patterns 150. The blocking patterns 150 may be interposed between the lower patterns 160 and the first dielectric patterns 120. The lower patterns 160 may vertically overlap the blocking patterns 50. The lower patterns 160, together with the blocking patterns 150, may extend in the second direction D2 and may be spaced apart from each other in the first direction D1. The lower patterns 160 may be disposed adjacent to lower portions of neighboring semiconductor patterns SP, and may vertically separate the bit lines BL from the blocking patterns 150. The blocking patterns 150 and the lower patterns 160 may vertically separate the first dielectric patterns 120 from the bit lines BL.

The lower pattern 160 may include at least one selected from hydrogen (H) and deuterium (D). For example, the lower pattern 160 may include silicon oxide including at least one selected from hydrogen and deuterium.

Referring to FIGS. 9 and 12, top surfaces of the blocking patterns 150 may have their profiles that are recessed toward the bit lines BL. The top surfaces of the blocking patterns 150 may have their curved profiles that are recessed toward bottom surfaces of the blocking patterns 150. For example, thicknesses in the third direction D3 of the blocking patterns 150 may be the largest at locations near adjacent semiconductor patterns SP. The thicknesses of the blocking patterns 150 may be the smallest in the vicinity of middle locations between the adjacent semiconductor patterns SP.

Referring to FIGS. 9 and 13, upper patterns 170 may be provided adjacent to upper portions of the first and second vertical parts V1 and V2 of the semiconductor patterns SP. The upper patterns 170 may be provided on the outer lateral surfaces V1*b* of the first vertical parts V1 and the outer lateral surfaces V2*b* of the second vertical parts V2. The upper patterns 170 may separate the first dielectric patterns 120 from the upper portions of the first and second vertical parts V1 and V2.

According to the present inventive concepts, there may be a reduction in contact resistance between a semiconductor pattern and a conductive line, and as a result, a semiconductor device may increase in reliability and electrical properties.

Although the present inventive concepts have been described in connection with some embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the present inventive concepts.

What is claimed is:

1. A semiconductor device, comprising:
- a first conductive line that extends in a first horizontal direction;
- a plurality of semiconductor patterns on the first conductive line and spaced apart from each other in the first horizontal direction, each semiconductor pattern of the plurality of semiconductor patterns including a first vertical part and a second vertical part that are opposite to each other in the first horizontal direction;
- a second conductive line that extends in a second horizontal direction between the first vertical part and the second vertical part of each semiconductor pattern of the plurality of semiconductor patterns, the second horizontal direction intersecting the first horizontal direction;
- a gate dielectric pattern between the first vertical part and the second vertical part and between the second vertical part and the second conductive line;
- a blocking pattern between neighboring semiconductor patterns of the plurality of semiconductor patterns; and
- a dielectric pattern between the neighboring semiconductor patterns,
- wherein the dielectric pattern is formed of at least one selected from silicon oxide, silicon oxynitride and low-k dielectric,
- wherein the blocking pattern contacts a lower surface of the dielectric pattern and an upper surface of the first conductive line, and
- wherein the blocking pattern includes at least one selected from a conductive material and a dielectric material including either silicon nitride or metal oxide.

2. The semiconductor device of claim 1,
- wherein, on the first conductive line, the blocking pattern is adjacent to lower portions of the neighboring semiconductor patterns.

3. The semiconductor device of claim 1,
- wherein the dielectric pattern includes an oxygen atom.

4. The semiconductor device of claim 1,
- wherein each semiconductor pattern of the plurality of semiconductor patterns further includes a horizontal part that connects the first vertical part and the second vertical part with each other.

5. The semiconductor device of claim 1, further comprising:
- a lower pattern between the neighboring semiconductor patterns and between the upper surface of the first conductive line and a lower surface of the blocking pattern.

6. The semiconductor device of claim 5,
- wherein the lower pattern is adjacent to lower portions of the neighboring semiconductor patterns.

7. The semiconductor device of claim 5, wherein the blocking pattern is between the lower pattern and the dielectric pattern.

8. The semiconductor device of claim 7, wherein the blocking pattern and the lower pattern vertically separate the dielectric pattern from the first conductive line.

9. The semiconductor device of claim 5, wherein the lower pattern includes at least one selected from hydrogen and deuterium.

10. The semiconductor device of claim 1, wherein a top surface of the blocking pattern is convex toward the first conductive line.

11. The semiconductor device of claim 1, further comprising:

an upper pattern between the neighboring semiconductor patterns, wherein the upper pattern is adjacent to upper portions of the neighboring semiconductor patterns.

12. The semiconductor device of claim 11, wherein the upper pattern separates the dielectric pattern from the upper portions of the neighboring semiconductor patterns.

13. A semiconductor device, comprising:

a first conductive line that extends in a first horizontal direction;

a plurality of semiconductor patterns, wherein each semiconductor pattern includes a first vertical part and a second vertical part that are opposite to each other in the first horizontal direction on the first conductive line;

a second conductive line that includes a first sub-conductive line covering an inner lateral surface of the first vertical part and a second sub-conductive line covering an inner lateral surface of the second vertical part, the inner lateral surface of the first vertical part and the inner lateral surface of the second vertical part being opposite to each other in the first horizontal direction;

a gate dielectric pattern between the inner lateral surface of the first vertical part and the first sub-conductive line and between the inner lateral surface of the second vertical part and the second sub-conductive line;

a pair of blocking patterns on the first conductive line, wherein one of the pair of blocking patterns is adjacent to a lower portion of an outer lateral surface of the first vertical part and the other of the pair of blocking patterns is adjacent to a lower portion of an outer lateral surface of the second vertical part; and a dielectric pattern between neighboring semiconductor patterns, wherein the dielectric pattern is formed of at least one selected from silicon oxide, silicon oxynitride and low-k dielectric, wherein the pair of blocking patterns vertically contact a lower surface of the dielectric pattern and an upper surface of the first conductive line, and wherein the pair of blocking patterns include at least one selected from a conductive material and a dielectric material including either silicon nitride or metal oxide.

14. The semiconductor device of claim 13, wherein each blocking pattern of the pair of blocking patterns includes at least one selected from a dielectric material and a conductive material.

15. The semiconductor device of claim 13, further comprising:

a pair of dielectric patterns on the outer lateral surface of the first vertical part and the outer lateral surface of the second vertical part, respectively, wherein each blocking pattern of the pair of blocking patterns vertically separates a corresponding dielectric pattern of the pair of dielectric patterns from the first conductive line.

16. The semiconductor device of claim 13, wherein in each semiconductor pattern, the semiconductor pattern further includes a horizontal part that connects the first vertical part and the second vertical part with each other.

* * * * *